(12) United States Patent
Kang

(10) Patent No.: US 7,599,208 B2
(45) Date of Patent: Oct. 6, 2009

(54) NONVOLATILE FERROELECTRIC MEMORY DEVICE AND REFRESH METHOD THEREOF

(75) Inventor: Hee Bok Kang, Cheongju-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 243 days.

(21) Appl. No.: 11/717,048

(22) Filed: Mar. 13, 2007

(65) Prior Publication Data

US 2008/0025105 A1  Jan. 31, 2008

(30) Foreign Application Priority Data

Jul. 27, 2006  (KR) ............... 10-2006-0070962
Dec. 22, 2006  (KR) ............... 10-2006-0132602

(51) Int. Cl.
   *G11C 11/22* (2006.01)
(52) U.S. Cl. ............ 365/145; 365/222; 365/236; 365/230.06
(58) Field of Classification Search ........ 365/145, 365/222, 236, 230.06, 189.05, 185.25, 233; 257/314–316, E27.112, E21.32, E21.561, 257/E21.663, E21.664
   See application file for complete search history.

(56) References Cited

U.S. PATENT DOCUMENTS 5,596,740 A * 1/1997 Quattromani et al. ....... 711/157
5,969,981 A * 10/1999 Kono .................... 365/145
6,054,734 A * 4/2000 Aozasa et al. ............ 257/315
6,144,583 A * 11/2000 Shiba .................. 365/185.13
6,775,172 B2   8/2004 Kang et al.
6,903,990 B2 * 6/2005 Mizugaki ................ 365/222
6,930,944 B2 * 8/2005 Hush ..................... 365/222
6,982,918 B2   1/2006 Fazan et al.

* cited by examiner

*Primary Examiner*—David Lam
(74) *Attorney, Agent, or Firm*—Finnegan, Henderson, Farabow, Garrett & Dunner, L.L.P.

(57) ABSTRACT

A nonvolatile ferroelectric memory device is provided which includes a cell array including a plurality of nonvolatile memory cells each configured to read/write data, a refresh control unit configured to control a refresh operation in a given cycle in response to a refresh control signal for improving retention characteristics of data stored in the plurality of nonvolatile memory cells to output a count address for refresh operations, a row address control unit configured to latch and decode a row address inputted in response to a RAS signal and an output signal from the refresh control unit and to select the count address, a column address control unit configured to latch and decode a column address inputted in response to a CAS signal, and an input/output logic circuit configured to control read/write operations of the cell array in response to an output enable signal and read/write commands.

64 Claims, 22 Drawing Sheets

NONVOLATILE FERROELECTRIC MEMORY DEVICE AND REFRESH METHOD THEREOF

RELATED APPLICATIONS

The present application claims the benefit of priority to Korean Patent Application Nos. 10-2006-0070962, filed on Jul. 27, 2006, and 10-2006-0132602, filed on Dec. 22, 2006, both of which are incorporated by reference in their entirety. Moreover, the present application is also related to U.S. Pat. Nos. 6,775,172, and 6,982,918, the contents of which are incorporated herein by reference in their entirety.

BACKGROUND

Technical Field

The present invention generally relates to a nonvolatile ferroelectric memory device and a refresh method thereof, and more specifically, to a technology of improving data retention characteristics of a One Transistor-Field Effect Transistor (1T-FET) type nonvolatile ferroelectric memory device.

In general, a volatile memory such as a DRAM requires a continuous power supply. When power is not supplied for even an instant, data may be destroyed because memory cells of the DRAM are designed to have small capacitors for keeping the charged power. If these capacitors are not recharged, then the capacitors lose the previously charged power, resulting in data loss.

A refresh operation refers to a recharging process of a memory cell in a memory chip. Memory cells in a row can be charged in each refresh cycle. Although the refresh operation is performed by memory control of the system, some chips are designed to perform a self-refresh operation.

For example, the technology has been disclosed where a DRAM chip has a self-refresh circuit configured to perform a self-refresh operation without a Central Processing Unit (CPU) or an external refresh circuit. The self-refresh method has been frequently used in portable computers to reduce power consumption.

In the conventional volatile DRAM having a short refresh cycle, the refresh operation is frequently performed, which results in large power consumption and degradation of operation performance.

As an example of these integrated circuits, a nonvolatile ferroelectric memory, specifically a Ferroelectric Random Access Memory (FeRAM) device, has attracted considerable attention as a next generation memory device because it has a data processing speed as fast as a Dynamic Random Access Memory (DRAM) and conserves data even after the power is turned off.

An FeRAM having a structure similar to that of a DRAM includes capacitors made of a ferroelectric substance, which has a high residual polarization allowing for retention of data after power is turned off.

A 1-Transistor 1-Capacitor (1T1C) type unit cell of the conventional FeRAM includes one switching element configured to perform a switching operation depending on a state of a word line to connect a nonvolatile ferroelectric capacitor to a bit line, and one nonvolatile ferroelectric capacitor connected between a plate line and one end of the switching element. The switching element of the conventional FeRAM is a NMOS transistor whose switching operation is controlled by a gate control signal.

SUMMARY

Embodiments of the present invention provide for preserving data of a nonvolatile FeRAM device when a power source is off and performing a refresh operation in a given cycle to restore degraded cell data, thereby improving data retention characteristics. Unlike DRAMs, the nonvolatile FeRAM device is configured to perform refresh operations less frequently during the whole data retention time including the on/off time of the power source, thereby reducing power consumption and improving operation performance.

Consistent with an embodiment of the present invention, a nonvolatile ferroelectric memory device including a plurality of nonvolatile memory cells each configured to read/write data comprises a register configured to store information of the plurality of nonvolatile memory cells, and a refresh control unit configured to perform a refresh operation in a given refresh cycle using the information stored the register to improve retention characteristics of data stored in the plurality of nonvolatile memory cells.

Consistent with an embodiment of the present invention, a nonvolatile ferroelectric memory device comprises a memory cell and a refresh control unit configured to perform a refresh operation in a given refresh cycle to improve retention characteristics of data stored in the memory cell. The memory cell comprises a SOI-structured substrate including a floating channel layer and drain/source regions located at both ends of the floating channel layer, a ferroelectric layer formed over the floating channel layer, and a word line formed over the ferroelectric layer. In the memory cell, a different channel resistance is induced to a channel region of the floating channel layer depending on polarity states of the ferroelectric layer so that data are read/written.

Consistent with an embodiment of the present invention, a nonvolatile ferroelectric memory device comprises a cell array including a plurality of memory cells each configured to read/write data, a refresh control unit configured to control a refresh in a given cycle in response to a refresh signal for improving retention characteristics of data stored in the plurality of nonvolatile memory cells to output a count address for refresh operations, a row address control unit configured to latch and decode a row address in response to a RAS signal and an output signal from the refresh control unit and to select the count address in the refresh mode, a column address control unit configured to latch and decode a column address inputted in response to a CAS signal, and an input/output logic circuit configured to control read/write operations of the cell array in response to an output enable signal and read/write commands.

Consistent with an embodiment of the present invention, a nonvolatile ferroelectric memory device comprises a cell array including a plurality of nonvolatile memory cells each configured to read/write data, a refresh information register configured to store various nonvolatile parameter information for controlling the refresh operation and to output a refresh control signal corresponding to the parameter information in the refresh mode, a refresh control unit configured to activate a refresh signal in response to a RAS signal, a CAS signal and the refresh control signal, a refresh counter configured to generate a count address in response to the refresh signal, and a column timing logic circuit configured to write data stored in a register in the memory cell corresponding to the count address.

Consistent with an embodiment of the present invention, a method for refreshing a nonvolatile ferroelectric memory device comprises the steps of: reading/writing data in a memory cell which has a 1T-FET type nonvolatile cell structure and refreshing data of the memory cell in a given refresh cycle to improve retention characteristics of data stored in the memory cell.

Consistent with an embodiment of the present invention, a method for refreshing a nonvolatile ferroelectric memory device comprises the steps of: sensing input of a RAS signal; sensing input of a CAS signal; activating a refresh signal in response to the RAS signal and the CAS signal; generating a count address in response to the refresh signal; and writing data stored in a register in a memory cell corresponding to the count address.

DETAILED DESCRIPTION

Embodiments consistent with the present invention will be described in detail with reference to the accompanying drawings.

Figure 1:
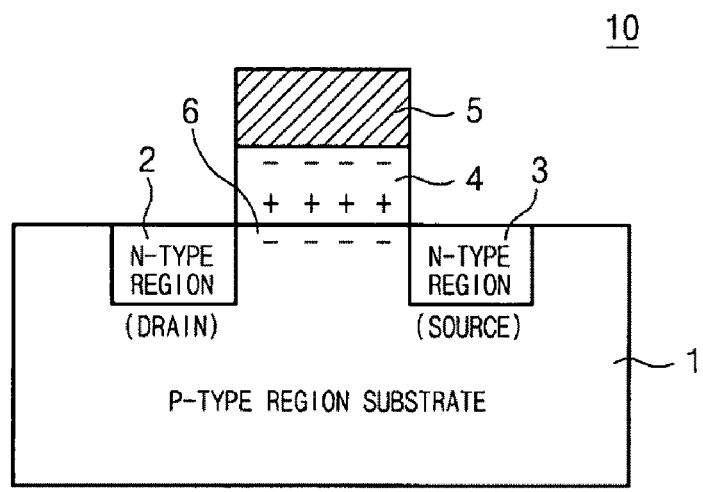
FIG. 1 is a cross-sectional diagram illustrating a cell of a conventional nonvolatile ferroelectric memory device.

FIG. 1 is a cross-sectional diagram illustrating a cell of a conventional nonvolatile ferroelectric memory device.

A conventional 1-Transistor Field Effect Transistor (1-T FET) type cell includes a P-type channel region 6, an N-type drain region 2 and an N-type source region 3 over a P-type region substrate 1. A ferroelectric layer 4 is formed over the channel region 6, and a word line 5 is formed over ferroelectric layer 4.

Data is read/written based on a channel resistance of the memory cell 10. The channel resistance may be differentiated depending on polarization states of ferroelectric layer 4.

When the polarity of ferroelectric layer 4 induces positive charges to channel region 6, memory cell 10 transitions to a high resistance channel state, and is turned off. On the other hand, when the polarity of the ferroelectric layer 4 induces negative charges to channel region 6, memory cell 10 transitions to a low resistance channel state, and is turned on. In this way, the conventional nonvolatile FeRAM device selects polarization kinds of ferroelectric layer 4 to write data in the cell, which becomes a nonvolatile memory cell.

However, although the 1T-FET type memory cell of the conventional FeRAM device has a nonvolatile characteristic, cell data is degraded as time passes which limits data retention life. As a result, data retention characteristics are degraded and the best state of nonvolatile cell storage characteristics is not maintained.

Figure 2:
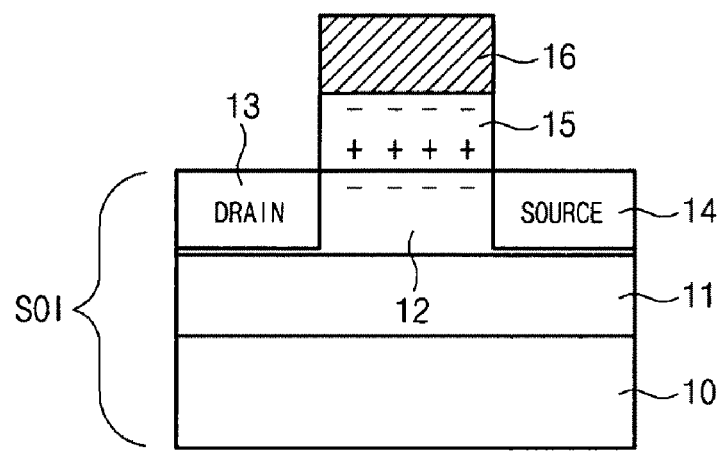
FIG. 2 is a cross-sectional diagram illustrating a cell of a nonvolatile ferroelectric memory device consistent with an embodiment of the present invention.

FIG. 2 is a cross-sectional diagram illustrating a cell of a nonvolatile ferroelectric memory device consistent with an embodiment of the present invention.

An insulating layer 11 is formed over a substrate 10 which includes a P-type or N-type silicon substrate. Insulating layer 11 may include an oxide layer.

A floating channel layer 12 is formed over insulating layer 11. A drain region 13 and a source region 14 are formed at both ends of floating channel layer 12. A ferroelectric layer 15 is formed over a channel region of floating channel layer 12, and a word line 16 is formed over ferroelectric layer 15.

Drain region 13 and source region 14 of floating channel layer 12 are formed to be N-type, and channel region 12 is formed to be P-type, and to float. In another embodiment consistent with the present invention, drain region 13 and source region 14 of floating channel layer 12 are formed to be P-type, and channel region 12 is formed to be N-type. A semiconductor of floating channel layer 12 may include a carbon nano tube, silicon, or germanium (Ge).

Floating channel layer 12, including substrate 10, insulating layer 11, and drain/source regions 13 and 14, is formed to have a Silicon On Insulator (SOI) structure. A 1T-FET type ferroelectric memory cell having a floating channel is formed over a silicon semiconductor substrate having a SOI structure.

Data is read/written depending on a channel resistance of floating channel layer 12. is the channel resistance may be differentiated depending on polarization states of ferroelectric layer 15.

Suppose that drain region 13 and source region 14 of floating channel layer 12 are formed to be N-type and channel region 12 is formed to be P-type. When the polarity of ferroelectric layer 15 induces positive charges to channel region 12, the memory cell transitions to a high resistance state so that the channel is turned off. On the other hand, when the polarity of ferroelectric layer 15 induces negative charges to channel region 12, the memory cell transitions to a low resistance state so that the channel is turned on. In this way, polarization states of ferroelectric layer 15 are selected to write data in the cell which becomes a nonvolatile memory cell.

Figure 3:
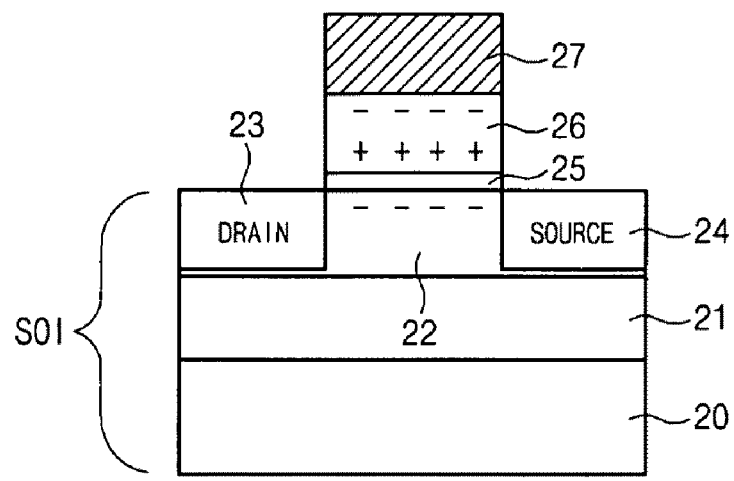
FIG. 3 is a cross-sectional diagram illustrating a cell of a nonvolatile ferroelectric memory device consistent with an embodiment of the present invention.

FIG. 3 is a cross-sectional diagram illustrating a cell of a nonvolatile ferroelectric memory device consistent with an embodiment of the present invention.

An insulating layer 21 is formed over a substrate 20. Insulating layer 21 includes an oxide layer. A floating channel layer 22 is formed over insulating layer 21. A drain region 23 and a source region 24 are formed at both ends of floating channel layer 22. A buffer insulating layer 25 is formed over a channel region of floating channel layer 22. A ferroelectric layer 26 is formed over buffer insulating layer 25, and a word line 27 is formed over ferroelectric layer 26.

Floating channel layer 22, including substrate 20, insulating layer 21, and drain/source regions 23 and 24, may be formed to have an SOI structure. Buffer insulating layer 25 is formed to overcome differences of the process and the material between floating channel layer 22 and ferroelectric layer 26.

Figure 4:
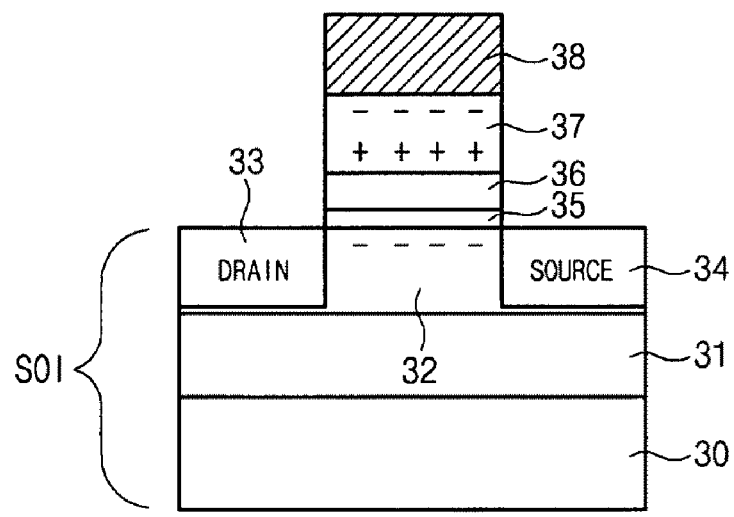
FIG. 4 is a cross-sectional diagram illustrating a cell of a nonvolatile ferroelectric memory device consistent with an embodiment of the present invention.

FIG. 4 is a cross-sectional diagram illustrating a cell of a nonvolatile ferroelectric memory device consistent with an embodiment of the present invention.

An insulating layer 31 is formed over a substrate 30. Insulating layer 31 includes an oxide layer. A floating channel layer 32 is formed over insulating layer 31. A drain region 33 and a source region 34 are formed at both ends of floating channel layer 32.

A buffer insulating layer 35 is formed over a channel region of floating channel layer 32. A floating conductive layer 36 is formed over buffer insulating layer 35, and a ferroelectric layer 37 is formed over floating conductive layer 36. A word line 27 is formed over ferroelectric layer 37.

Floating channel layer 32, including substrate 30, insulating layer 31, and drain/source regions 33 and 34, is formed to have an SOI structure. Buffer insulating layer 35 is formed for electric insulation between floating channel layer 32 and floating conductive layer 36. Floating conductive layer 36 protects polarization charges of ferroelectric layer 37 to improve data retention characteristics.

Figure 5:
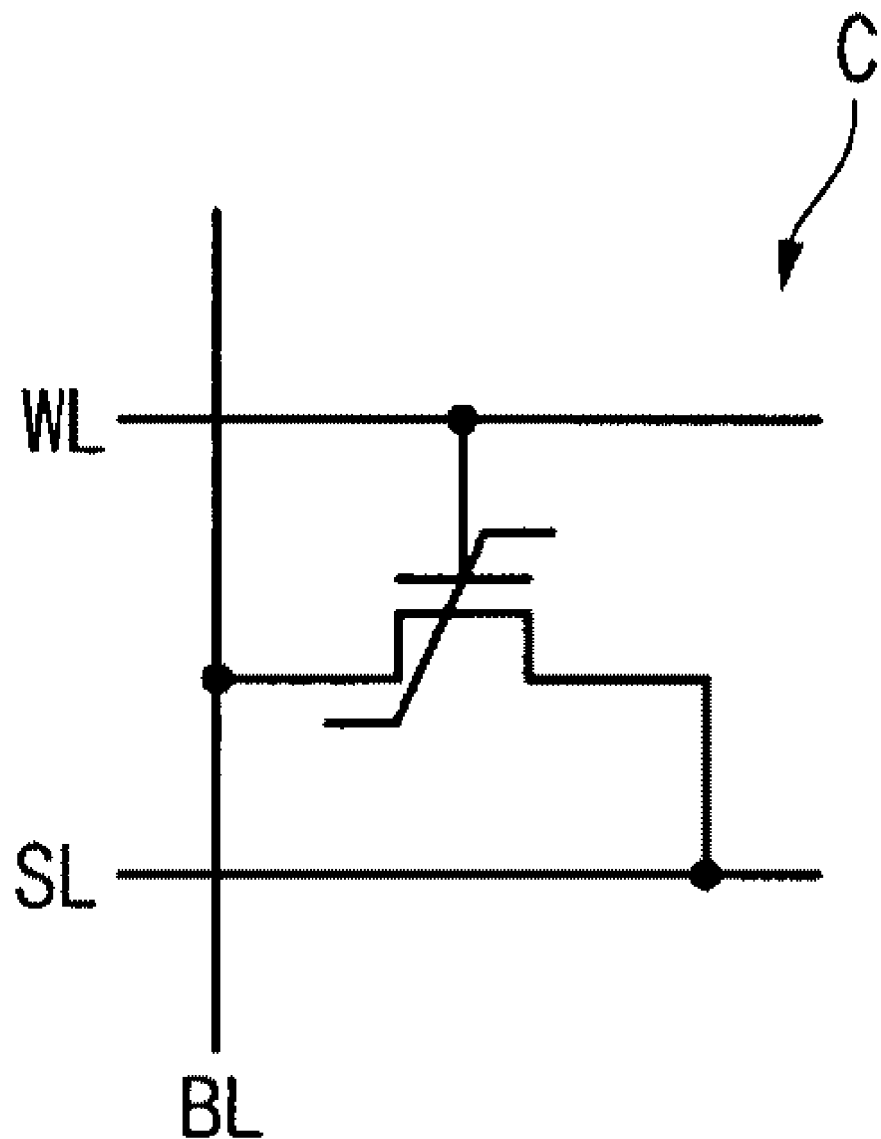
FIG. 5 is a symbol diagram illustrating a unit cell of a nonvolatile ferroelectric memory device consistent with an embodiment of the present invention.

FIG. 5 is a symbol diagram illustrating a unit cell C of a 1T-FET type nonvolatile ferroelectric memory device consistent with an embodiment of the present invention. Unit cell C has a drain connected to a bit line BL, a source connected to a sensing line SL, and a gate connected to a word line WL.

Although the memory cell consistent with this embodiment of the present invention has a 1T-FET structure, the memory cell may have a 1T1C structure including one transistor and one ferroelectric capacitor.

Figure 6:
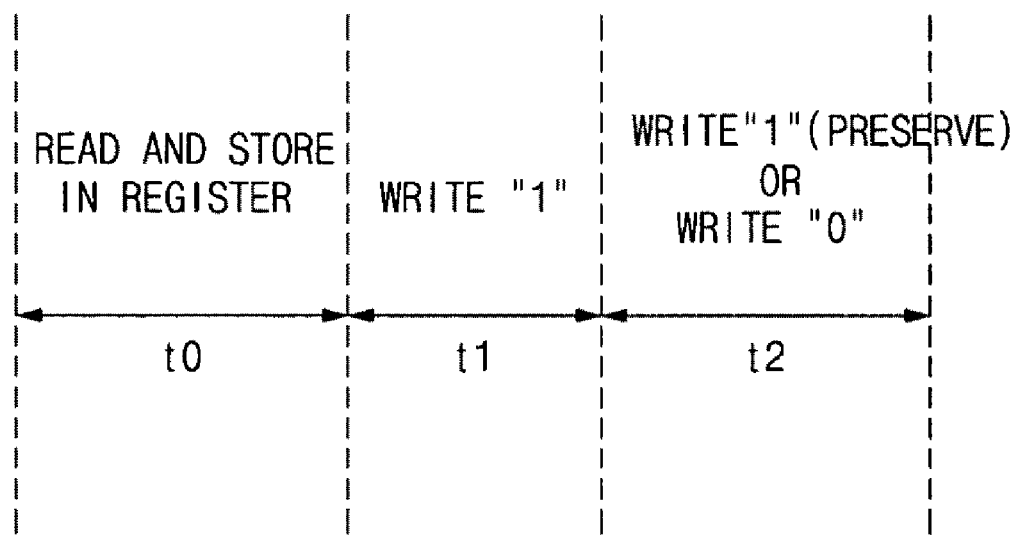
FIG. 6 is a timing diagram illustrating a write cycle of a nonvolatile ferroelectric memory device consistent with an embodiment of the present invention.

FIG. 6 is a timing diagram illustrating a write cycle of a nonvolatile ferroelectric memory device consistent with an embodiment of the present invention.

In period t0, data of all cells of the selected row address are read, amplified, and stored in a register. Since data "1" is written in all memory cells in period t1, it is not known which data are stored in the existing memory cell. As a result, data are stored in order to know which data are stored in the existing memory cell before the data "1" is written in the memory cell.

In period t1, data "1" is written in all cells of the selected row address. In period t2, the data stored in the register are rewritten and restored in the memory cell so that new external data are written in new cells. As a result, data "1" is preserved because data "1" is previously written in period t1, and new data is written to data "0" stored in the memory cell.

Figure 7A:
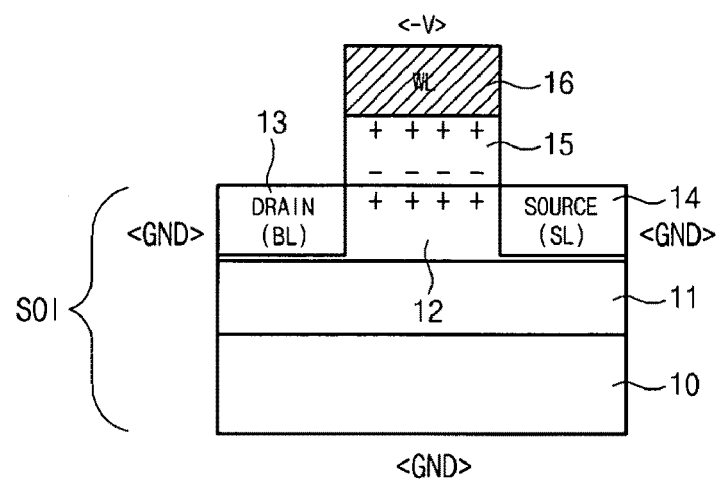
FIGS. 7a and 7b are diagrams illustrating a write operation of high data of a nonvolatile ferroelectric memory device consistent with an embodiment of the present invention.
Figure 7B:
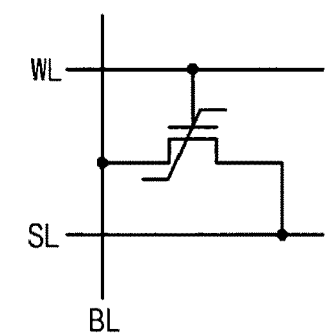
Figure 7B:
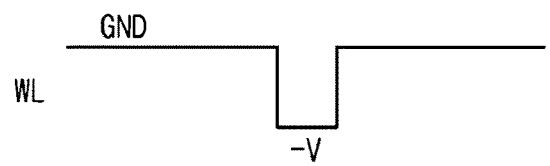
Figure 7B:
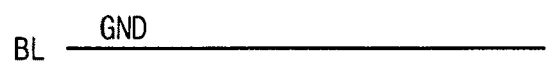
Figure 7B:

FIGS. 7a and 7b are diagrams illustrating a write operation of high data of a nonvolatile ferroelectric memory device consistent with an embodiment of the present invention.

When data "1" is written, a ground voltage <GND> is applied to substrate 10, bit line BL and sensing line SL. A voltage level of word line WL transitions from ground voltage <GND> to a negative voltage <−V>.

Word line WL has a negative polarity, and floating channel layer 12 has a positive polarity. That is, positive charges are induced to the channel region of floating channel layer 12 depending on the polarity of ferroelectric layer 15 so that the memory cell is at a high resistance state. Positive charges are induced to the channel region of floating channel layer 12, and drain region 13 and source region 14 are at a ground state so that the channel region of floating channel layer 12 is kept off. As a result, data "1" is written in the all memory cells in a write mode.

Figure 8A:
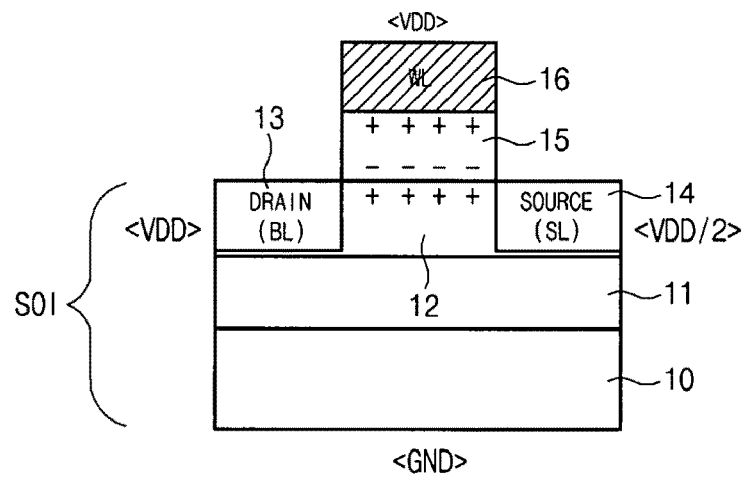
FIGS. 8a and 8b are diagrams illustrating a retention operation of high data of a nonvolatile ferroelectric memory device consistent with an embodiment of the present invention.
Figure 8B:
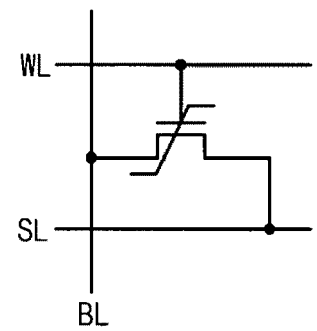
Figure 8B:
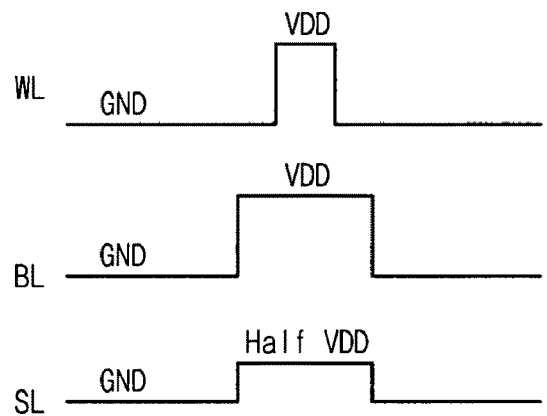

FIGS. 8a and 8b are diagrams illustrating a retention operation of high data of a nonvolatile ferroelectric memory device consistent with an embodiment of the present invention.

When data "1" is preserved while stored in the memory cell, ground voltage <GND> is applied to substrate 10, a power voltage <VDD> is applied to bit line BL, and a ½ power voltage <½×VDD> is applied to sensing line SL. A voltage level of word line WL transitions from ground voltage <GND> to power voltage <VDD>.

Word line WL and floating channel layer 12 have a positive polarity so that the channel region is turned off. As a result, there is no voltage difference between the positive voltage of the floated channel region and power voltage <VDD> of word line 16.

That is, positive charges are induced to the channel region of floating channel layer 12 depending on the polarity of ferroelectric layer 15 so that the memory cell is at a high resistance state. As a result, the polarity of ferroelectric layer 15 is not changed but maintained so that data "1" stored in all memory cells is also maintained.

Figure 9A:
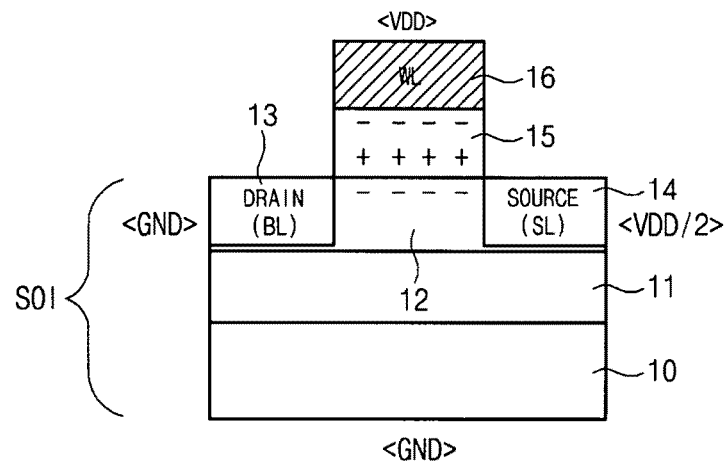
FIGS. 9a and 9b are diagrams illustrating a write operation of low data of a nonvolatile ferroelectric memory device consistent with an embodiment of the present invention.
Figure 9B:
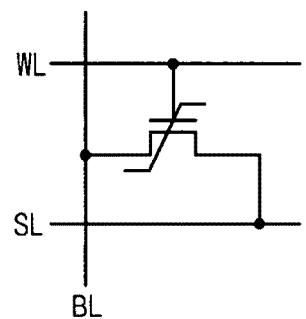
Figure 9B:
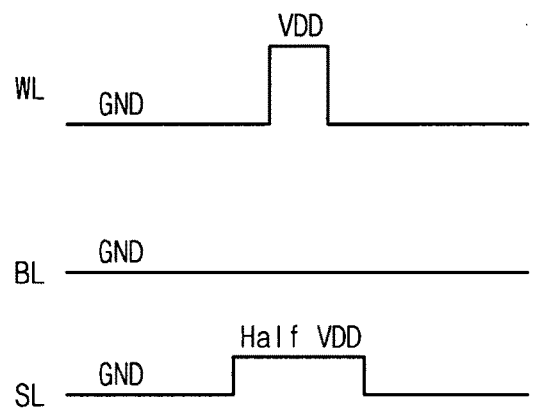

FIGS. 9a and 9b are diagrams illustrating a write operation of low data of a nonvolatile ferroelectric memory device consistent with an embodiment of the present invention.

When data "0" is written, ground voltage <GND> is applied to substrate 10 and bit line BL, and ½ power voltage <½×VDD> is applied to sensing line SL. A voltage level of word line WL transitions from ground voltage <GND> to power voltage <VDD>.

Word line WL has a positive polarity, and floating channel layer 12 has a negative polarity. That is, negative charges are induced to the channel region of floating channel layer 12 depending on the polarity of ferroelectric layer 15 so that the memory cell is at a low resistance state. As a result, the channel region of floating channel layer 12 is turned on so that data "0" is written in all memory cells.

Figure 10A:
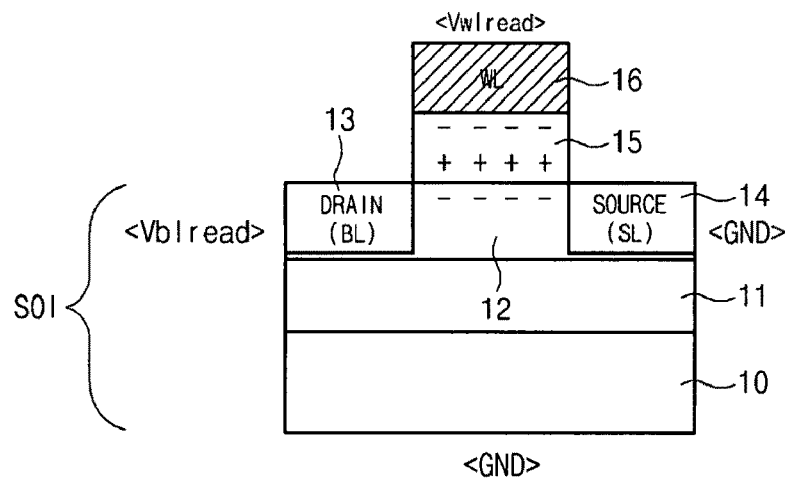
FIGS. 10a and 10b are diagrams illustrating a data read operation of a nonvolatile ferroelectric memory device consistent with an embodiment of the present invention.
Figure 10B:
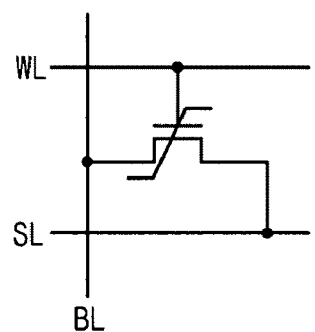
Figure 10B:
Figure 10B:
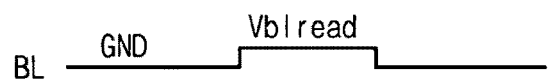
Figure 10B:

FIGS. 10a and 10b are diagrams illustrating a data read operation of a nonvolatile ferroelectric memory device consistent with an embodiment of the present invention.

When data are read, ground voltage <GND> is applied to substrate 10, a bit line read voltage <Vblread> is applied to bit line BL, and ground voltage <GND> is applied to sensing line SL. A voltage level of word line WL transitions from ground voltage <GND> to a word line read voltage <Vwlread>. As a result, current flowing in bit line BL is differentiated depending on the polarity of ferroelectric layer 15 so that the data are read.

That is, positive charges are induced to the channel region of floating channel region 12, bit line read voltage <vblread> is applied to drain region 13, and the channel region of floating channel layer 12 is kept off when source region 14 is at a ground state. Even when a slight voltage difference is applied between drain region 13 and source region 14, the channel region is turned off so that the small amount of current flows. As a result, data "1" stored in the memory cell can be read in a read mode.

On the other hand, negative charges are induced to the channel region of floating channel region 12, bit line read voltage <Vblread> is applied to drain region 13, and the channel region of floating channel layer 12 is kept off when source region 14 is at the ground state. Even when a slight voltage difference is applied between drain region 13 and source region 14, the channel region is turned on so that the large amount of current flows. As a result, data "0" stored in the memory cell can be read in the read mode.

Figure 11A:
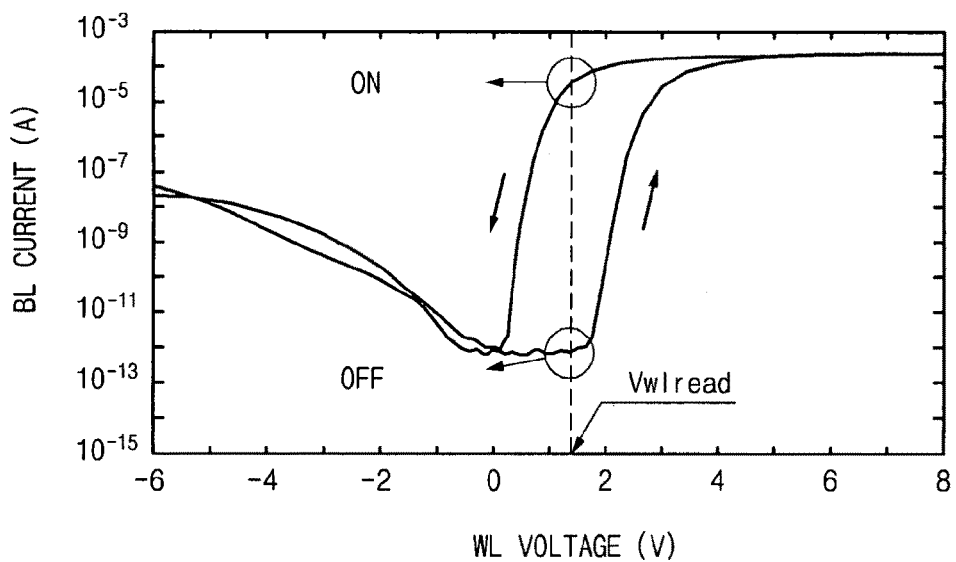
FIGS. 11a and 11b are graphs illustrating bit line current in a read mode of a nonvolatile memory device consistent with an embodiment of the present invention.
Figure 11B:
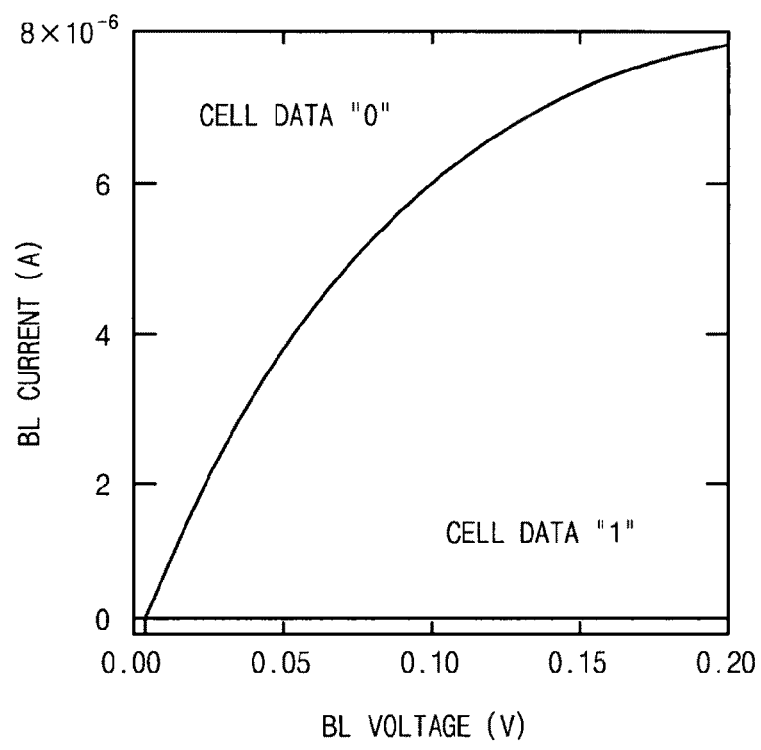

FIGS. 11a and 11b are graphs illustrating bit line BL current in a read mode of a nonvolatile memory device consistent with an embodiment of the present invention.

When the channel region of floating channel layer 12 is turned on/off, a voltage value is set to be word line read voltage <Vwlread>. That is, the largest amount of bit line BL current flows when the channel region is turned on, and the smallest amount of bit line BL current flows when the channel region is turned off.

When a voltage of bit line BL is changed while the same word line read voltage <Vwlread> is applied, bit line current values are differentiated depending on cell data stored in the memory cell. That is, when data "0" is stored in the memory cell, the voltage of bit line BL increases to flow the large amount of bit line BL current. On the other hand, when data "1" is stored in the memory cell, the small amount of bit line BL current flows even though the voltage of bit line BL increases.

Figure 12:
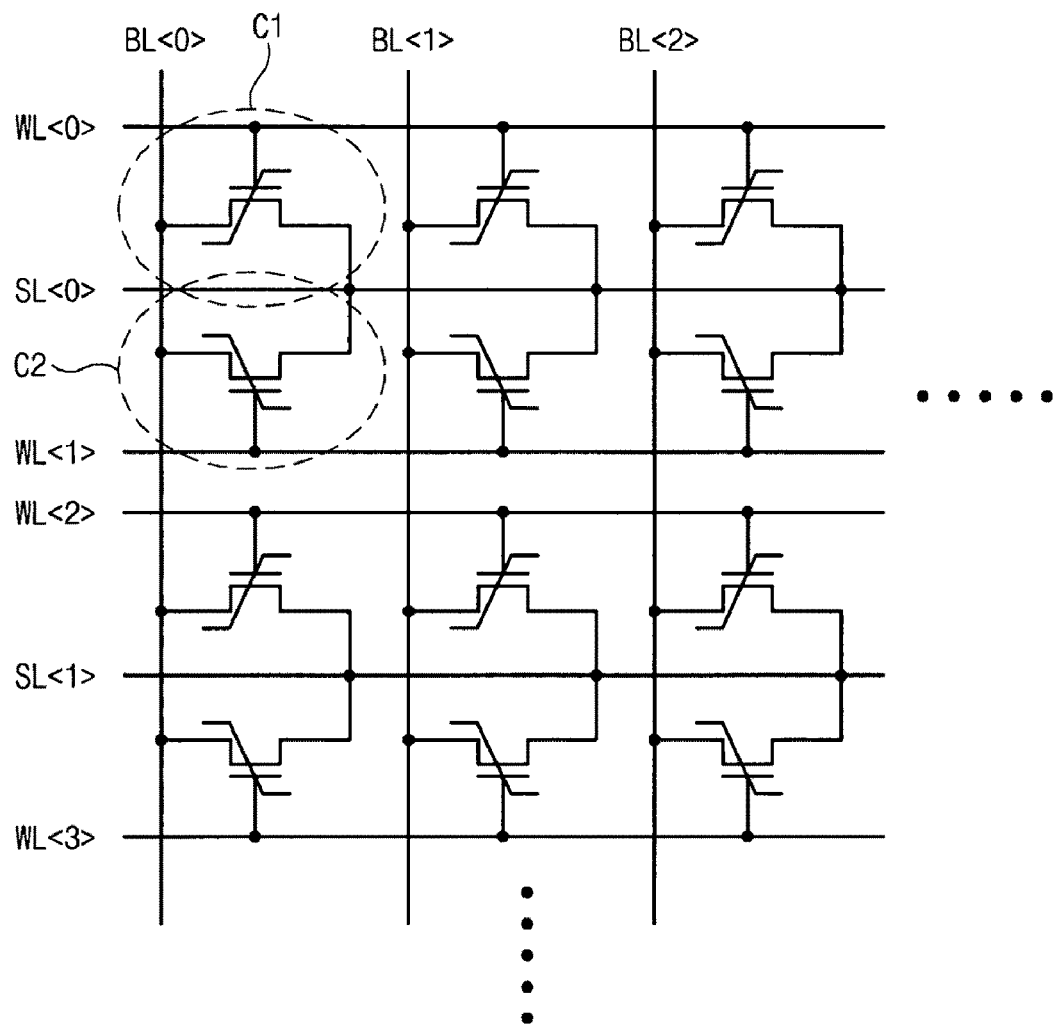
FIG. 12 is a diagram illustrating a cell array of a nonvolatile ferroelectric memory device consistent with an embodiment of the present invention.

FIG. 12 is a diagram illustrating a cell array of a nonvolatile ferroelectric memory device consistent with an embodiment of the present invention.

The cell array includes a plurality of word lines WL and a plurality of sensing lines SL which are arranged with a given interval in a row direction. A plurality of bit lines BL are arranged in a column direction so that bit lines BL are crossed with the plurality of word lines WL and the plurality of sensing lines SL. A plurality of unit cells C are formed where the plurality of bit lines BL, the plurality of word lines WL, and the plurality of sensing lines SL are crossed.

Adjacent unit cells C1 and C2 have a common source connected to sensing line SL and a common drain connected to bit line BL. Gates of unit cells C1 and C2 are connected to word lines WL<0> and WL<1>, respectively.

Figure 13:
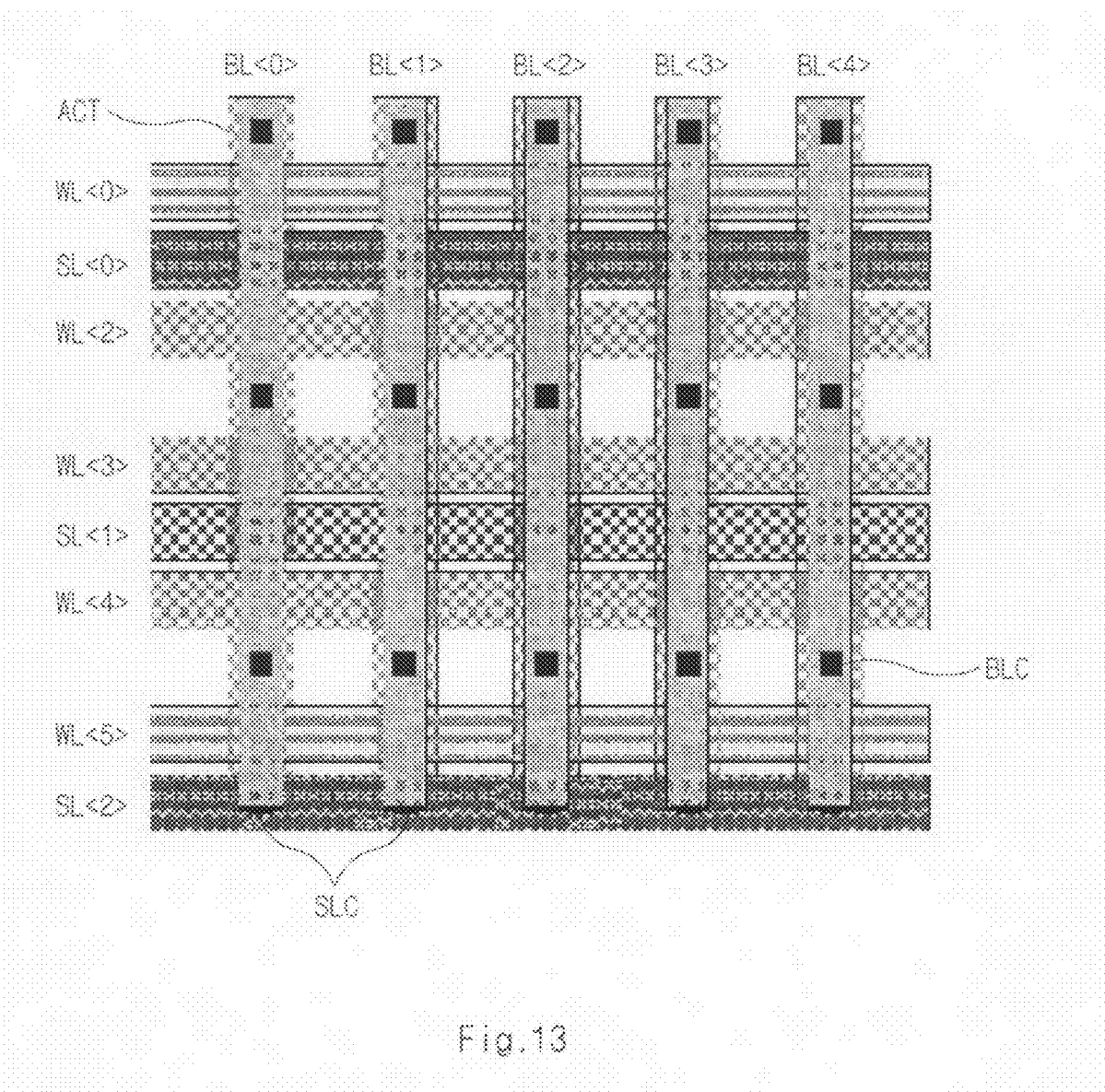
FIG. 13 is a layout diagram illustrating a cell array of a nonvolatile ferroelectric memory device consistent with an embodiment of the present invention.

FIG. 13 is a layout diagram illustrating a cell array of a nonvolatile ferroelectric memory device consistent with an embodiment of the present invention.

A plurality of unit cells C are formed over one active region ACT. Adjacent unit cells C1 and C2 have a common source to share a sensing line contact SLC and a common drain to share a bit line contact BLC.

In the embodiment, the plurality of unit cells C share one active region ACT not to have a space, thereby reducing the layout area of the memory cells.

Figure 14:
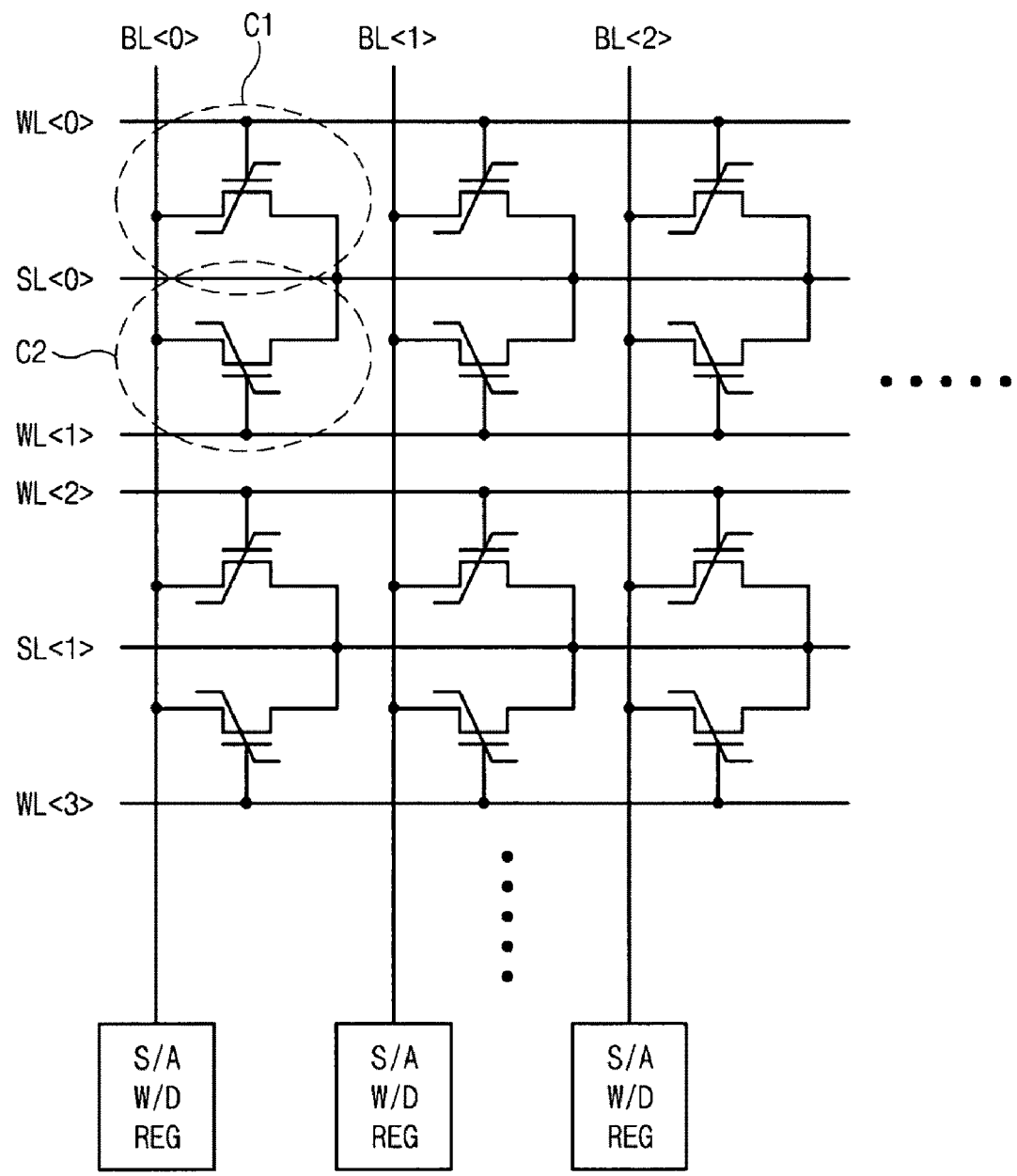
FIG. 14 is a diagram illustrating a sense amplifier, a write driver and a register of a nonvolatile ferroelectric memory device consistent with an embodiment of the present invention.

FIG. 14 is a diagram illustrating a sense amplifier S/A, a write driver W/D, and a register REG of a nonvolatile ferroelectric memory device consistent with an embodiment of the present invention.

Sense amplifier S/A senses and amplifies cell data to distinguish data "1" from data "0" so that sense amplifier S/A is connected to bit line BL. When data are written in the memory cell, write driver W/D is configured to generate a driving voltage depending on write data to supply the driving voltage to bit line BL. Write driver W/D is connected to bit line BL. Register REG as a temporary memory element for storing data of sense amplifier S/A temporarily is connected to bit line BL.

Figure 15:
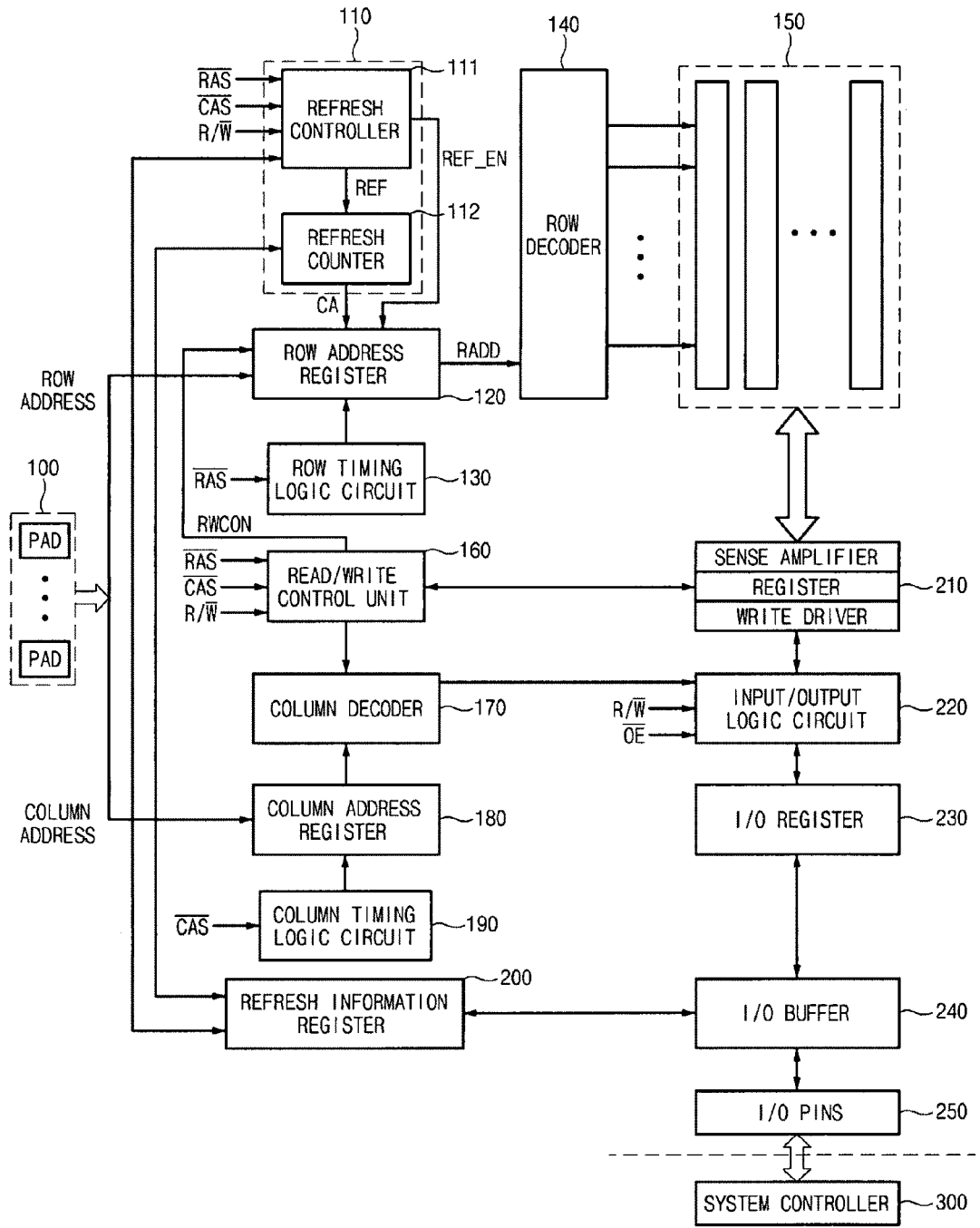
FIG. 15 is a diagram illustrating a nonvolatile ferroelectric memory device consistent with an embodiment of the present invention.

FIG. 15 is a diagram illustrating a nonvolatile ferroelectric memory device consistent with an embodiment of the present invention.

The nonvolatile ferroelectric memory device includes a pad array 100, a refresh control unit 110, a row address register 120, a row timing logic circuit 130, a row decoder 140, a cell array 150, a read/write control unit 160, a column decoder 170, a column address register 180, a column timing logic circuit 190, a refresh information register 200, a sense amplifier, register and write driver 210, an input/output logic circuit 220, an I/O register 230, an I/O buffer 240, and I/O pins 250.

Refresh control unit 110 includes a refresh controller 111 and a refresh counter 112. Cell array 150 includes one structure of 1T-FET type unit cells of FIGS. 2 through 4.

Pad array 100 includes a plurality of pads PAD each configured to receive a row address and a column address to output the addresses with a time variance. Refresh controller 111 outputs a refresh signal REF and a refresh enable signal REF_EN for controlling a refresh operation in response to a RAS signal /RAS, a CAS signal /CAS, read/write commands R and /W, and refresh control signal. Refresh counter 112 counts a refresh cycle in response to refresh signal REF applied from refresh controller 111 and the refresh control signal received from refresh information register 200 to output a count address CA. Refresh controller 111 and refresh counter 112 output refresh operation information and refresh count information to refresh information register 200

Row address register 120 receives the row address received from pad array unit 100 and stores the address temporarily. Row address register 120 outputs row address RADD activated in response to an output signal from row timing logic circuit 130 and a read/write control signal RWCON received from read/write control unit 160 into row decoder 140. Row timing logic circuit 130 controls the storage operation and address output timing of row address register 120 in response to a RAS signal /RAS. Row decoder 140 decodes row address RADD applied from row address register 120 to output the address to cell array 150.

Read/write control unit 160 outputs read/write control signal RWCON for controlling read/write operations into row address register 120 in response to a RAS signal /RAS, a CAS signal /CAS, and a read/write command R/W to control column decoder 170, sense amplifier, register, and write driver 210.

Column decoder 170 decodes the column address applied from column address register 180 depending on control of read/write control unit 160 to output the address to input/output logic circuit 220. Column address register 180 temporarily stores the column address received from pad array 100 to output the address into column decoder 170 depending on control of column timing logic circuit 190.

Column timing logic circuit 190 controls the storage operation and address output timing of column address register 180 in response to CAS signal /CAS. Register 210 outputs refresh data to the memory cell depending on control of column timing logic circuit 190 when refresh signal REF is activated.

Refresh information register 200 is a nonvolatile register configured to store parameters related to refresh operations. Refresh information register 200 stores refresh count information, power-off timing information of the system or internal memories, and other parameter information to output a refresh control signal based on the parameter information in the refresh operations. In the power-off timing, information of refresh control unit 111 and refresh counter 112 is transmitted into refresh information register 200, and information related to external commands received from I/O buffer 240 is stored. The information stored in refresh information register 200 through I/O buffer 240 and I/O pins 250 is output into a system controller 300.

Sense amplifier S/A senses and amplifies cell data to distinguish data "1" from data "0". Write driver W/D generates a driving voltage in response to write data when data are written in the memory cell to supply the driving voltage to the bit line. Register REG temporarily stores data sensed in sense amplifier S/A and again stores data in the memory cell in the write operation.

Input/output logic circuit 220 reads data stored in cell array 150 depending on an output signal from column decoder 170 and read/write commands R and /W, and stores data in cell array 150. Input/output logic circuit 220 includes a column selecting signal C/S and outputs data stored in cell array 150 to data I/O register 230 in response to an output enable signal /OE.

I/O buffer 240 buffers read data stored in I/O register 230 to output the buffered data into I/O pins 250. I/O buffer 240 buffers write data received through I/O pins 250 to output the buffered data into I/O register 230. I/O buffer 240 outputs information stored in refresh information register 200 into system controller 300 through I/O pins 250. I/O pins 250 outputs data received from I/O buffer 240 into system controller 300 through data buses, or outputs data from system controller 300 through the data buses into I/O buffer 240.

Figure 16:
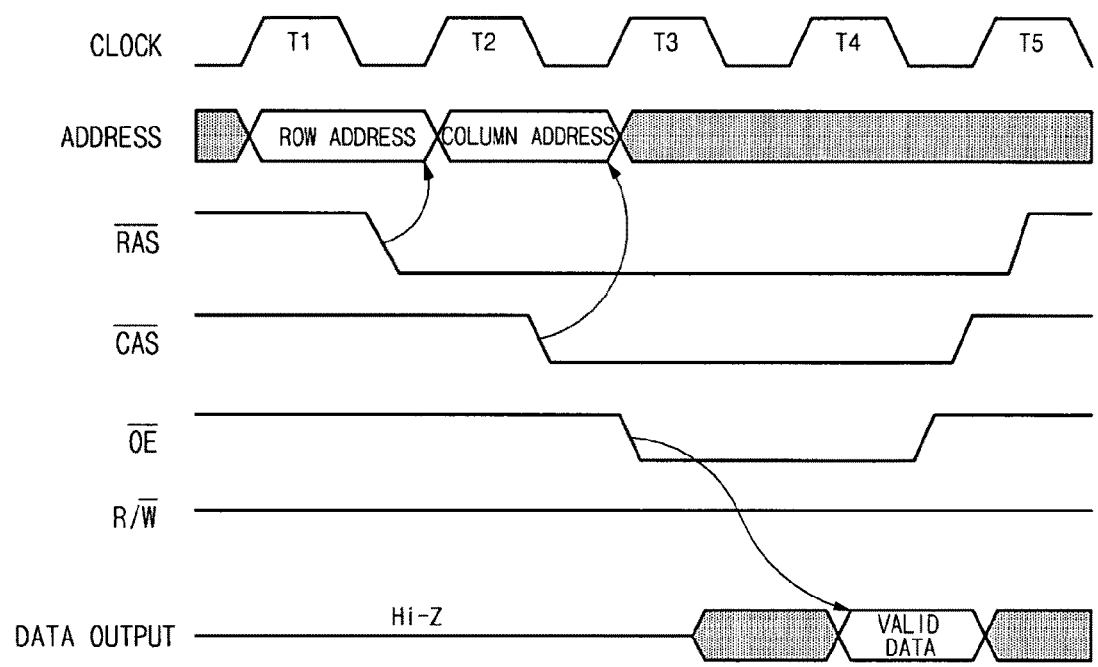
FIG. 16 is a timing diagram illustrating a read operation of a nonvolatile ferroelectric memory device consistent with an embodiment of the present invention.
Figure 17:
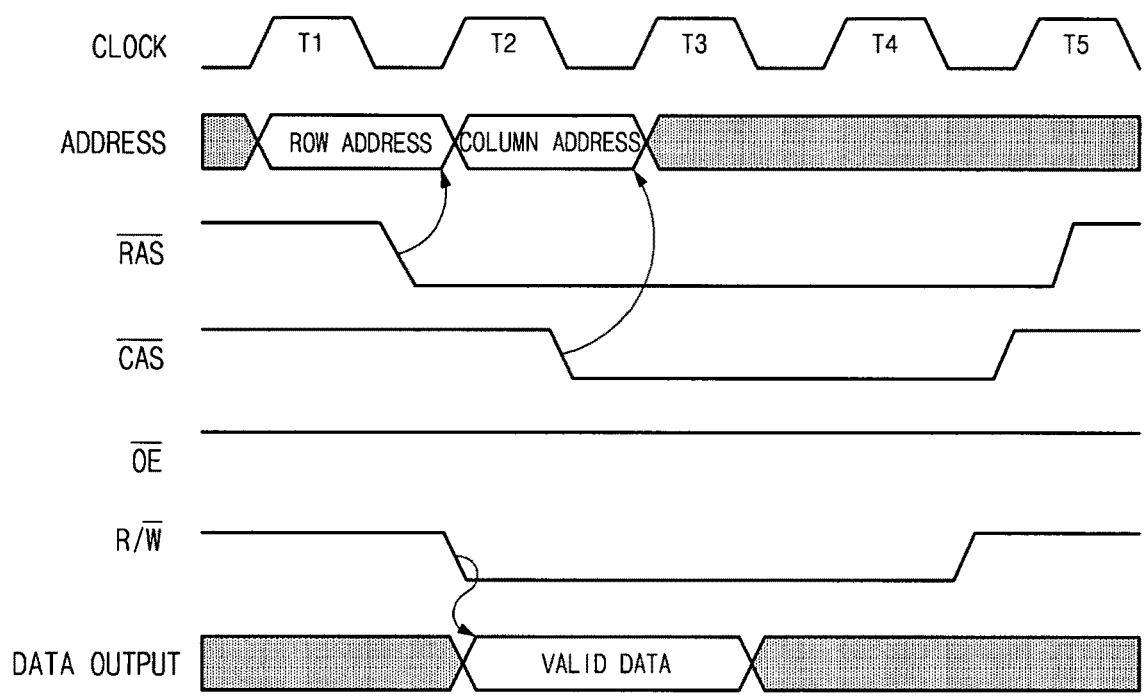
FIG. 17 is a timing diagram illustrating a write operation of a nonvolatile ferroelectric memory device consistent with an embodiment of the present invention.

FIG. 16 is a timing diagram illustrating a read operation of a nonvolatile ferroelectric memory device consistent with an embodiment of the present invention, and FIG. 17 is a timing diagram illustrating a write operation of a nonvolatile ferroelectric memory device consistent with an embodiment of the present invention.

Pad array 100 receives a row address and a column address through a plurality of pads PAD, and outputs the addresses to row address register 120 and column address register 180. Row address register 120 and column address register 180 output the row address and the column address with a given time difference depending on control of row timing logic circuit 130 and column timing logic circuit 190 by timing multiplexing.

Row address register 120 stores the row address temporarily in synchronization with RAS signal /RAS and outputs the row address to row decoder 140. When the row address is output, column address register 180 stores the column address temporarily.

Row address register 120 selects a row address received from pad array 100 in a normal operation to output the address into row decoder 140. When a refresh enable signal REF_EN is activated in a refresh mode, row address register 120 selects a count address CA received from refresh counter 112 to output the address into row decoder 140.

Column address register 180 temporarily stores the column address in synchronization with CAS signal /CAS and outputs the column address to column decoder 170. When the column address is output, row address register 120 stores the row address temporarily.

In the read mode, when output enable signal /OE is activated while read command R is activated, data stored in cell array 150 are output to I/O register 230 depending on input/output logic circuit 220. On the other hand, in the write mode, when output enable signal /OE is inactivated while write command /W is activated, data are stored in cell array 150 depending on input/output logic circuit 220.

Figure 18:
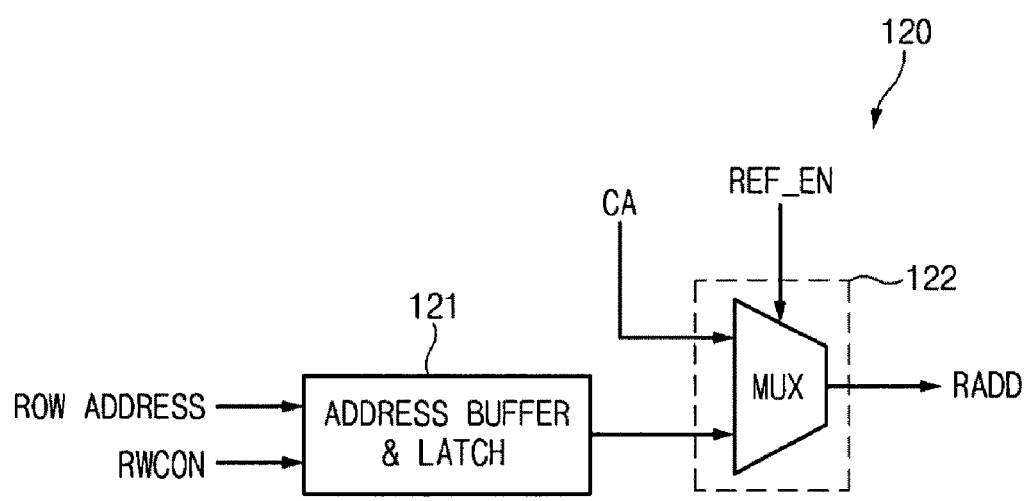
FIG. 18 is a diagram illustrating a row address register of FIG. 15.

FIG. 18 is a diagram illustrating row address register 120 of FIG. 15.

Row address register 120 includes an address buffer and latch 121 and a selecting unit 122. Selecting unit 122 includes a multiplexer.

Address buffer and latch 121 buffers and latches the row address received from pad array 100 in response to a read/write control signal RWCON received from read/write control unit 160. Selecting unit 122 selects one of count address CA and output signals from address buffer and latch 121 in response to refresh enable signal REF_EN received from refresh control unit 111 to output activated row address RADD into row decoder 140.

Row address register 120 selects the row address received from pad array 100 in the normal mode to output the address into row decoder 140. When refresh enable signal REF_EN is activated in the refresh mode, row address register 120 selects count address CA received from refresh counter 112 to output the address into row decoder 140.

Figure 19:
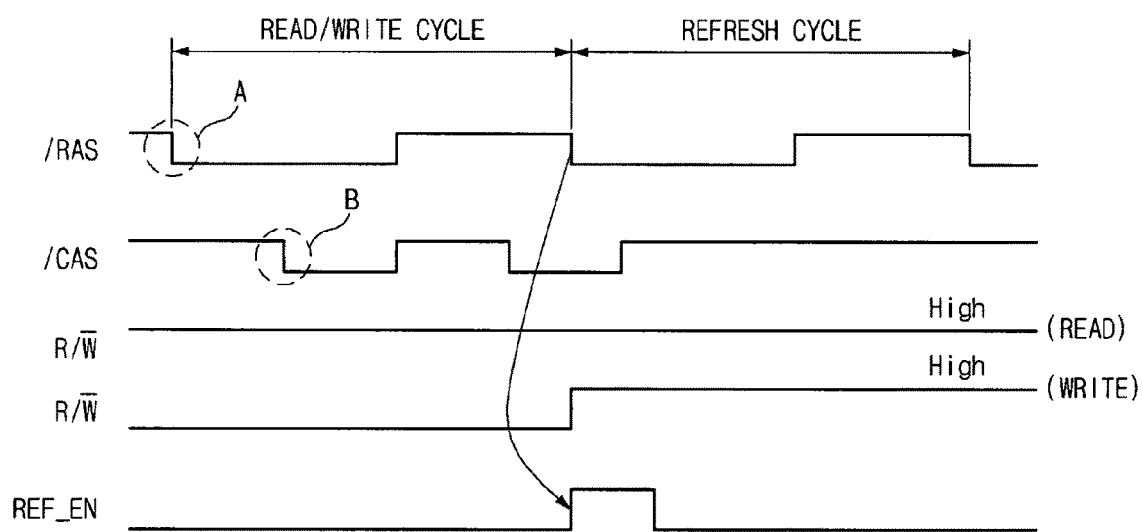
FIG. 19 is timing diagram illustrating a method for refreshing a nonvolatile ferroelectric memory device consistent with an embodiment of the present invention.

FIG. 19 is a timing diagram illustrating a method for refreshing a nonvolatile ferroelectric memory device consistent with an embodiment of the present invention.

Refresh controller 111 outputs refresh signal REF for performing a refresh operation into refresh counter 112, and outputs refresh enable signal REF_EN into row address register 120 in response to RAS signal /RAS, CAS signal /CAS, read/write commands R and /W, and the refresh control signal when a refresh operation command is applied. Refresh counter 112 counts a refresh cycle in response to refresh signal REF applied from refresh controller 111 and the refresh control signal to output count address CA to row address register 120.

Count address CA output from refresh counter 112 is stored in row address register 120. Column timing logic circuit 190 outputs data stored in column address register 180 into column decoder 170 in response to CAS signal /CAS. When sense amplifier S/A is activated, refresh data stored in register REG through input/output logic circuit 220 are written in cell array 150.

Refresh signal REF may be a control signal using RAS signal /RAS and CAS signal /CAS. That is, when refresh signal REF is a control signal using RAS signal /RAS and CAS signal /CAS, the refresh operation is performed with a /CAS before /RAS system (/CBR).

In the normal mode for performing read and write operations, RAS signal /RAS is activated earlier than CAS signal /CAS so that a normal operation is performed depending on row timing logic circuit 130 and column timing logic circuit 190. As shown in (A), when RAS signal /RAS is activated earlier, an external row address is activated so that sense amplifier S/A is activated. As shown in (B), when CAS signal /CAS is activated, an external column address is activated.

In the refresh mode, refresh control unit 111 senses CAS signal /CAS transitioned earlier than RAS signal /RAS to activate refresh signal REF/. That is, when refresh control unit 111 senses CAS signal /CAS transitioning earlier than RAS signal /RAS, refresh control unit 111 decides that the memory device is entering the refresh mode and activates refresh enable signal REF_EN.

Row address register 120 performs a refresh operation in response to count address CD generated depending on refresh counter 112 while a path of the normal mode is disconnected when refresh enable signal REF_EN is activated. Row address register 120 may sense a simultaneous transition of CAS signal /CAS and RAS signal /RAS to activate refresh signal REF.

Although the method for refreshing using /CBR system is exemplified in this embodiment consistent with the present invention, the refresh operation may be performed by various methods with self-refresh, auto-refresh, or clock.

In the refresh mode, a word line WL of cell array 150, which is an output signal of refresh counter 112, is selected depending on count address CA. As a result, data of the corresponding cell having a 1T structure in cell array 150 are sensed, amplified, and stored in sense amplifier register REG. New data are written in cell array 150, or the data stored in register REG are again stored in cell array 150.

Figure 20:
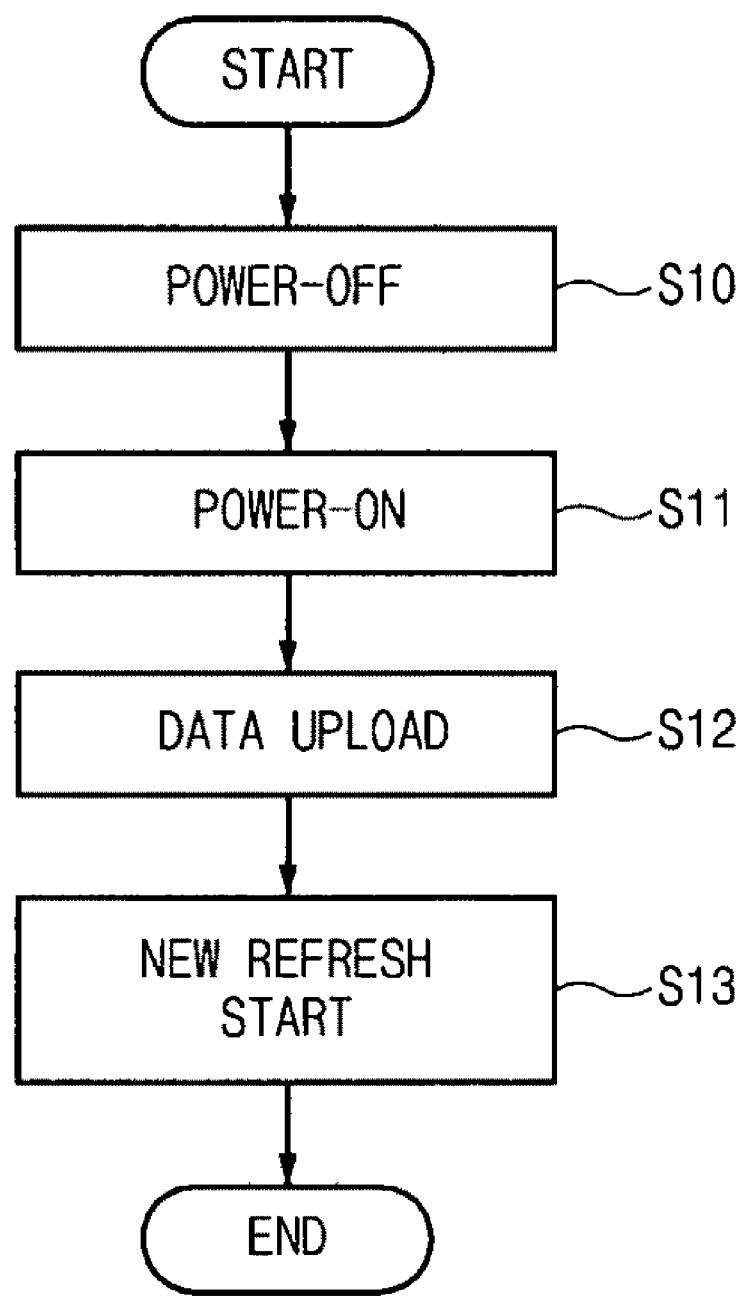
FIG. 20 is a flow chart illustrating a method for refreshing a volatile memory device such as a DRAM.
Figure 21:
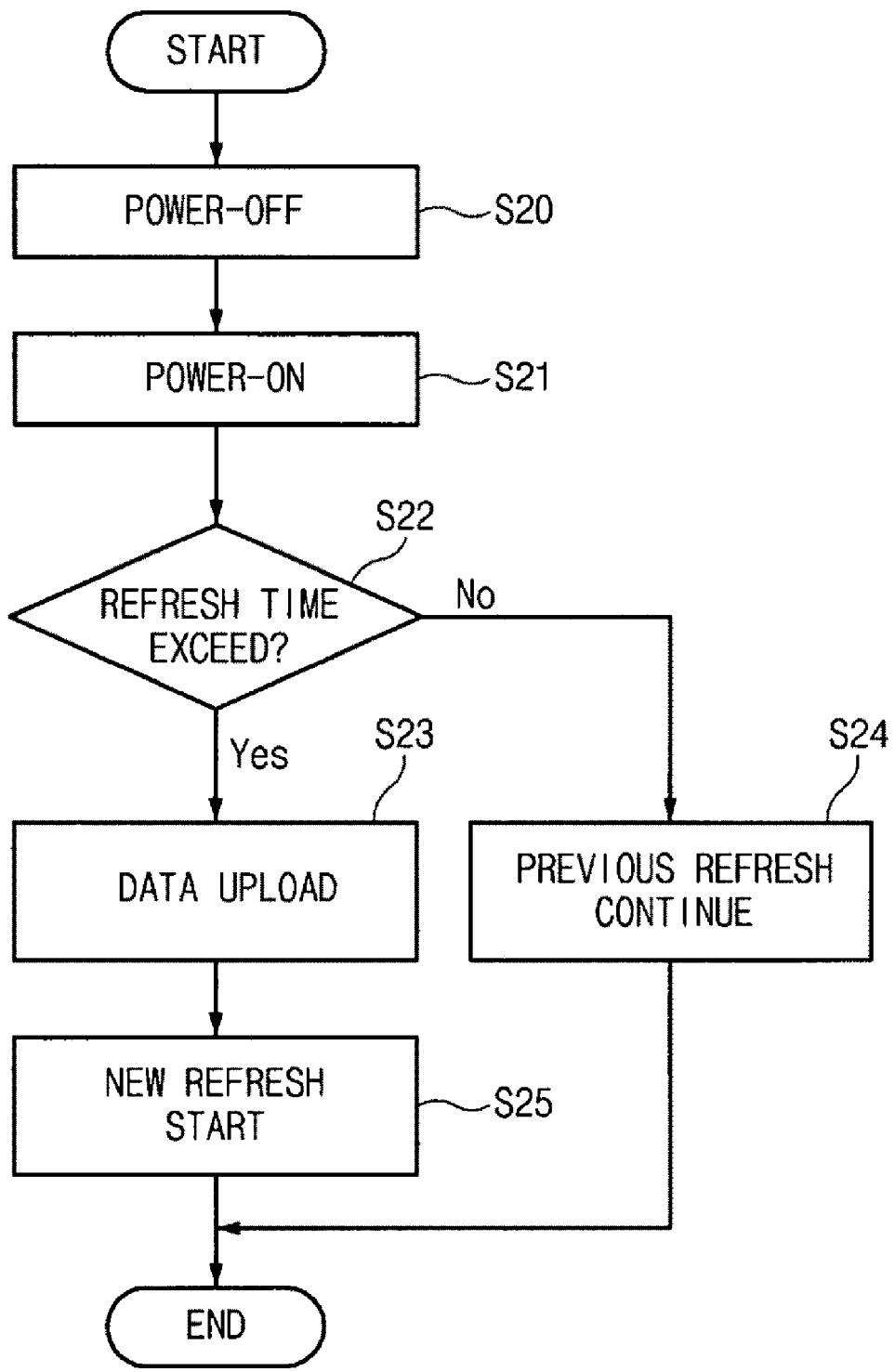
FIG. 21 is a flow chart illustrating a method for refreshing a nonvolatile ferroelectric memory device such as a DRAM consistent with an embodiment of the present invention.

FIGS. 20 and 21 are flow charts illustrating a method for refreshing memory devices. Specifically, FIG. 20 is a flow chart illustrating a method for refreshing a DRAM device, and FIG. 21 is a flow chart illustrating a method for refreshing a nonvolatile ferroelectric memory device consistent with an embodiment of the present invention.

When the power is turned on (S11) while a system power of the DRAM, a volatile memory, is turned off (S10), data of the memory are uploaded (S12) so that a new refresh operation starts (S13). That is, when the system power is turned on, data of the memory are required to be uploaded.

However, in the nonvolatile ferroelectric memory device consistent with an embodiment of the present invention, when the power is turned on (S21) while the system power is turned off (S20), the refresh information register 200 decides whether the refresh time is exceeded (S22).

When the refresh time is exceeded, data of the memory are uploaded (S23) so that a new refresh operation starts (S25). On the other hand, when the refresh time is not exceeded, the refresh time is effective so that the previous refresh operation continues (S24).

Refresh information register 200 stores a parameter related to the refresh operation in a nonvolatile register. Refresh information register 200 stores refresh count information, power-off timing information of the system or internal memories, and other parameter information to be nonvolatile. In refresh information register 200, an additional power sensing unit (not shown) senses on/off states of the system or the internal memory.

When the power is off, data stored in refresh information register 200 are read to calculate the refresh passing time. The refresh passing time can be stored in a mode register set MRS and controlled in a system level.

The refresh passing time calculated in response to the refresh control signal is transmitted into refresh control unit 111 in response to the refresh control signal. As a result, in this embodiment consistent with the present invention, it is unnecessary to upload the refresh related information even when the power is on.

Figure 22:
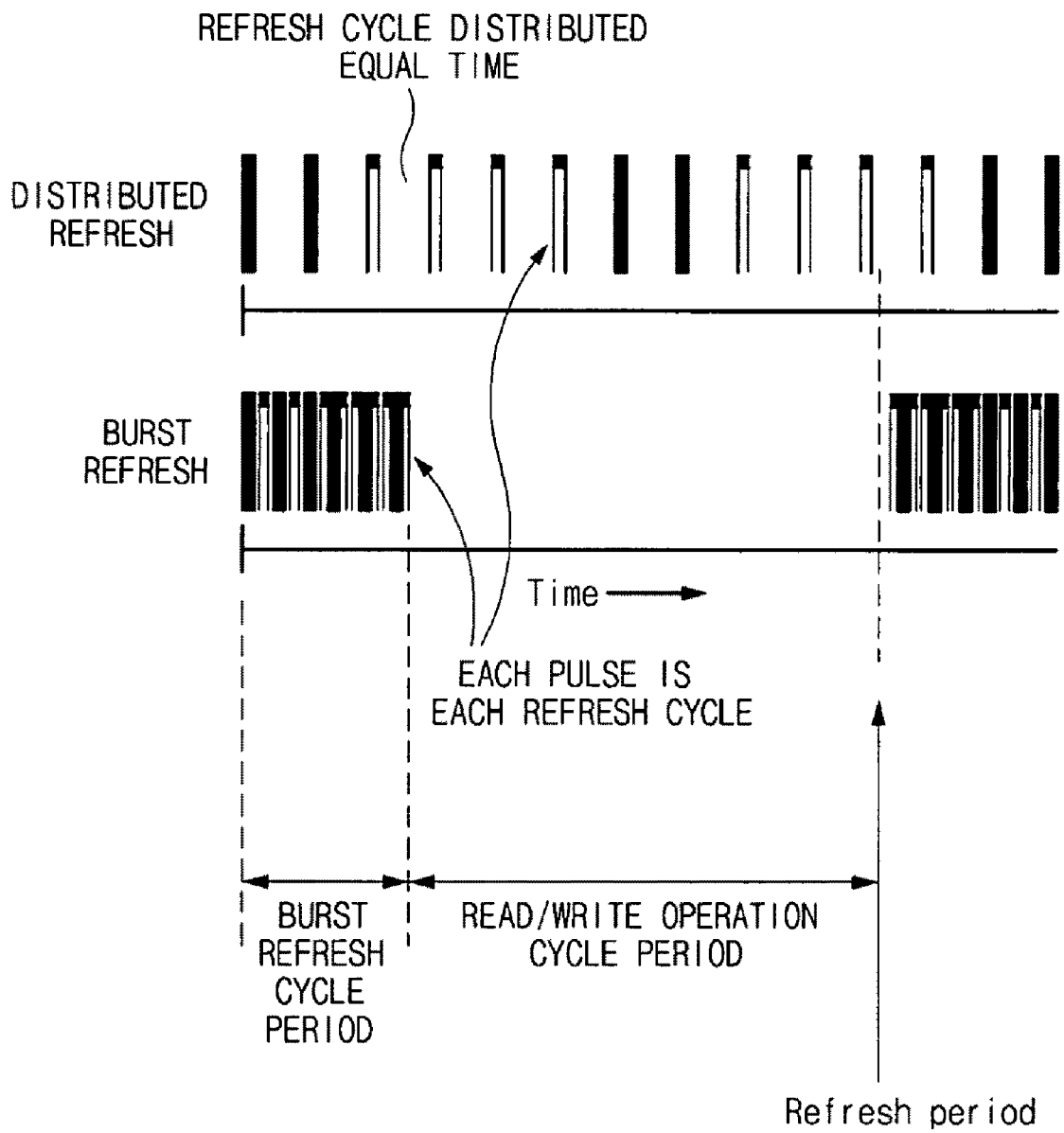
FIG. 22 is a diagram illustrating a method for refreshing a nonvolatile ferroelectric memory device consistent with an embodiment of the present invention.

FIG. 22 is a diagram illustrating a method for refreshing a nonvolatile ferroelectric memory device consistent with an embodiment of the present invention. The method includes a distributed refresh method and a burst refresh method.

In the distributed refresh method, the refresh operation is performed with the same time distribution so that all cells may be refreshed within the refresh time in response to count address CA counted in refresh counter 112. That is, when 8 k rows are refreshed, each distributed refresh operation cycle is represented by (refresh time)/8 k. As a result, the cell becomes initialized only when data are written in all word lines WL.

In the burst refresh method, 8 k refresh cycles are continuously performed within a burst refresh cycle time. Each pulse means each refresh cycle, and a normal operation is performed in read/write operation cycle periods where the pulse is inactivated.

Figure 23:
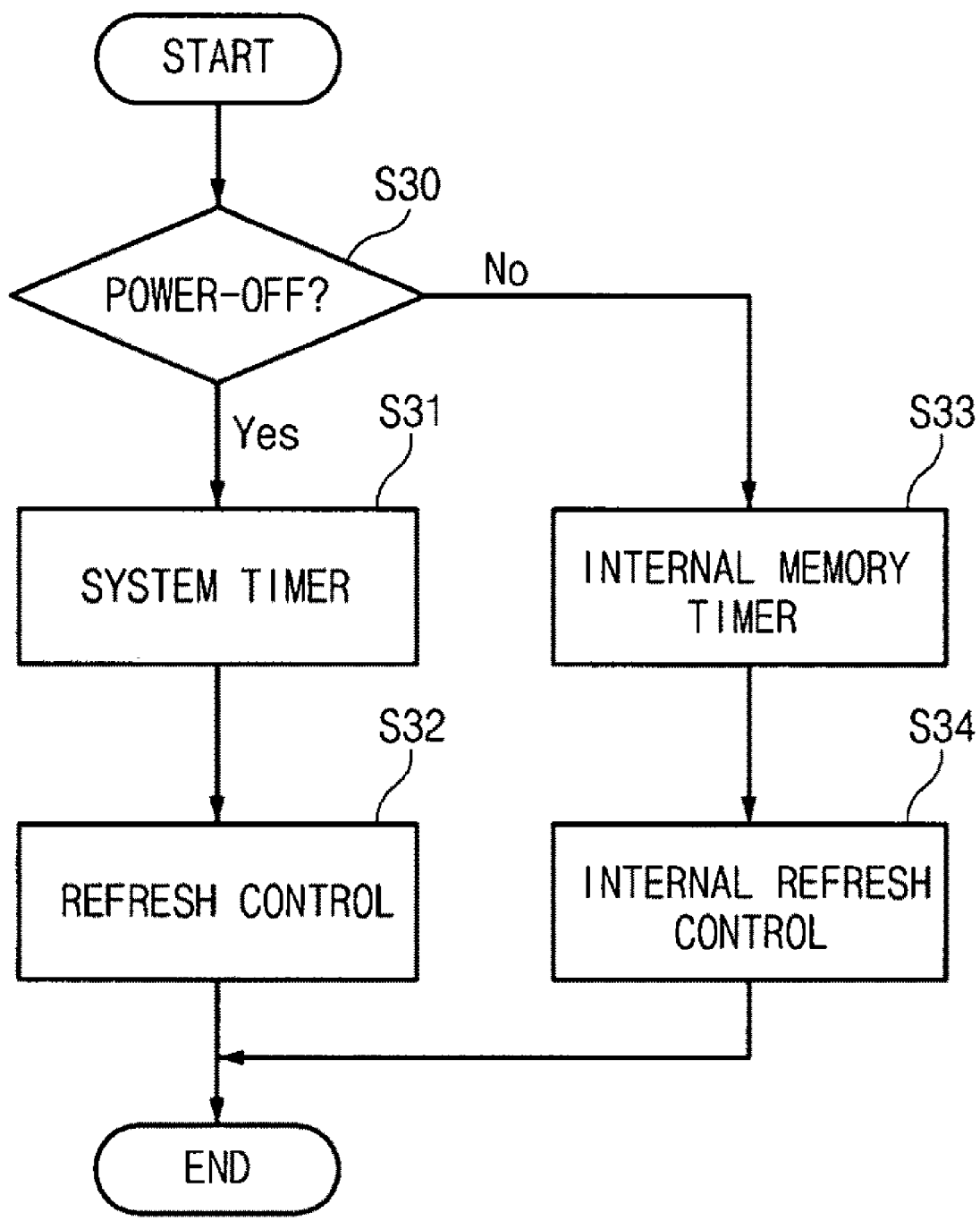
FIG. 23 is a diagram illustrating a timer control operation in the method for refreshing a nonvolatile ferroelectric memory device consistent with an embodiment of the present invention.

FIG. 23 is a diagram illustrating a timer control operation in the method for refreshing a nonvolatile ferroelectric memory device consistent with an embodiment of the present invention.

Refresh information register 200 identifies whether the system power is off and stores the result (S30). When the power is off, a system timer in the system is used (S31) while an internal memory timer is off so that the refresh operation is controlled (S32). The system timer stores a date and a time with a battery while the power source is required to be on continuously.

On the other hand, when the power is not off, the internal memory timer operated individually is used (S33) so that the internal refresh operation is controlled (S34).

One of the external system timer or the internal memory timer is selected depending on on/off states of the power through input/output data pins 250. That is, the refresh information register of the memory device including the memory timer exchanges data with the data buses through I/O buffer 240 and I/O pins 250. The system CPU including the system timers exchanges data with the memory device through the data buses.

When the power is off through data exchange between the memory device and system controller 300, the refresh operation is performed with the external system timer whose power is continuously on. When the power is on, the refresh operation is performed with the internal memory timer.

As a result, the refresh period and the memory data are effectively maintained regardless of the power on/off state of the memory chip. Between the refresh periods, the memory chip power is turned off to reduce power consumption, and a chip power is supplied only in the refresh period.

Figure 24:
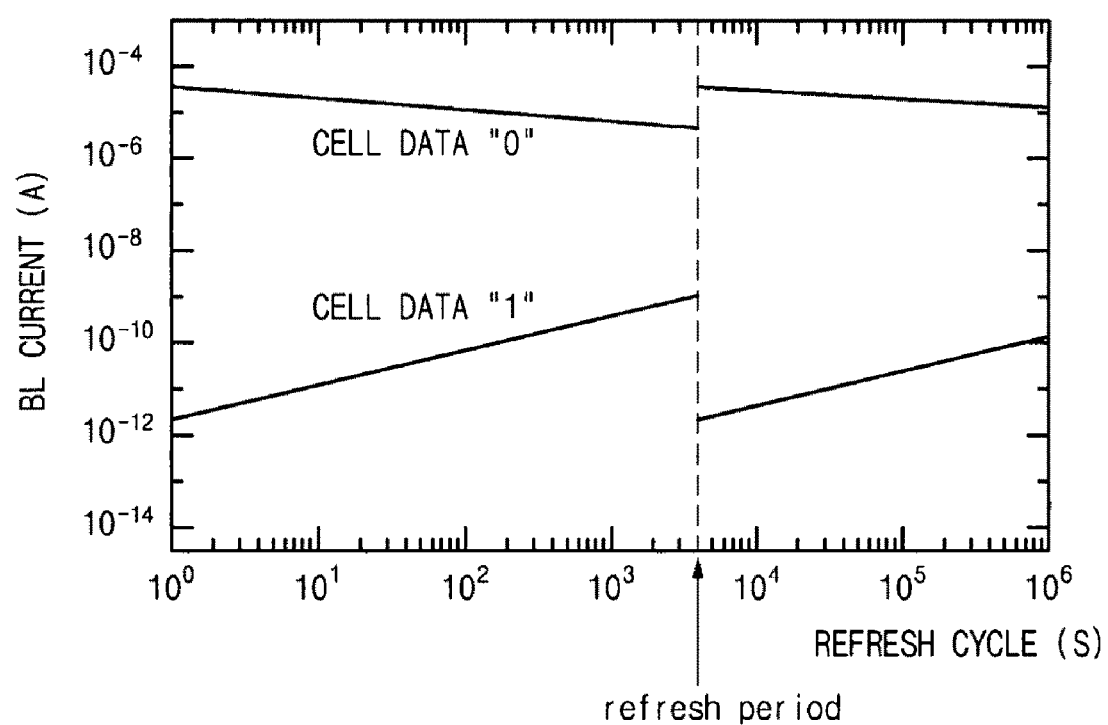
FIG. 24 is a graph illustrating a data retaining characteristic of a nonvolatile ferroelectric memory device consistent with an embodiment of the present invention.

FIG. 24 is a graph illustrating data retention characteristics of a nonvolatile ferroelectric memory device consistent with an embodiment of the present invention.

Although the 1T-FET type memory cell of the conventional FeRAM device has a nonvolatile characteristic, cell data are degraded as time passes thereby limiting data retention life. As a result, bit line BL current corresponding to cell data "1" and "0" is reduced as time passes by.

However, the refresh operation is performed with a given cycle at a given timing when bit line BL current is reduced, thereby restoring cell data to improve data retention characteristics.

When the data retention characteristics of the memory cell are reduced to over a pre-set target value, a refresh circuit is driven to restore the cell data at the initial state. The degradation limit target time of the cell becomes a refresh time so that all cells are operated within the refresh time.

The above-described FeRAM has nonvolatile characteristics, and retains stored data even when a power source is no longer supplied to the FeRAM, unlike the conventional DRAM. The on/off time of the power source is added and set as the whole data retention time so that the refresh operation is not frequently performed, thereby reducing power consumption and improving operation performance.

As described above, in a nonvolatile ferroelectric memory device consistent with an embodiment of the present invention, a refresh operation is performed with a given cycle while data are preserved when a power source is off to restore degraded cell data and improve data retention characteristics. Also, the nonvolatile ferroelectric memory device does not frequently perform a refresh operation during the whole data retention time including the on/off time of the power source, thereby reducing power consumption and improving operation performance.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A nonvolatile ferroelectric memory device including a plurality of nonvolatile memory cells each configured to read/write data, the device comprising:
    a register configured to temporarily store data read from the plurality of nonvolatile memory cells;
    a refresh information register configured to store nonvolatile parameter information for a refresh passing time and a refresh cycle and generate a refresh control signal by using the refresh passing time and the refresh cycle; and
    a refresh control unit configured to perform a refresh operation in response to the refresh control signal so as to write data stored in the register to one or more of the plurality of nonvolatile memory cells.

2. The nonvolatile ferroelectric memory device according to claim 1, wherein the refresh control unit comprises:
    a refresh controller configured to perform a refresh operation, in response to the refresh control signal, and to output a refresh signal and a refresh enable signal;
    a refresh counter configured to count a refresh cycle in response to the refresh signal and to output a count address; and
    a row address register configured to select the count address and to output the count address into a row decoder when the refresh enable signal is activated.

3. The nonvolatile ferroelectric memory device according to claim 1, further comprising a column timing logic circuit configured to activate the register in the refresh operation.

4. The nonvolatile ferroelectric memory device according to claim 3, further comprising a pad array unit configured to selectively input an input address with a given time difference by a multiplexing system.

5. The nonvolatile ferroelectric memory device according to claim 1, wherein the memory cell has a 1T-FET type cell structure.

6. The nonvolatile ferroelectric memory device according to claim 1, wherein the memory cell comprises:
    a silicon-on-insulator (SOI)-structured substrate including a floating channel layer and drain/source regions located at both ends of the floating channel layer;
    a ferroelectric layer formed over the floating channel layer; and
    a word line formed over the ferroelectric layer,
    wherein a different channel resistance is induced to a channel region of the floating channel layer depending on polarity states of the ferroelectric layer so that data are read/written.

7. The nonvolatile ferroelectric memory device according to claim 6, wherein the SOI-structured substrate comprises:
    a P-type or N-type semiconductor region substrate;
    an insulating layer formed over the substrate; and
    a floating channel layer formed over the insulating layer, and the floating channel layer including the drain/source regions.

8. The nonvolatile ferroelectric memory device according to claim 6, wherein the memory cell further includes a buffer insulating layer formed between the floating channel layer and the ferroelectric layer.

9. The nonvolatile ferroelectric memory device according to claim 8, wherein the memory cell further includes a floating conductive layer formed between the buffer insulating layer and the ferroelectric layer.

10. The nonvolatile ferroelectric memory device according to claim 6, wherein high data are written in the memory cell when a negative voltage is applied to the word line while a ground voltage is applied to the drain/source regions.

11. The nonvolatile ferroelectric memory device according to claim 6, wherein the high data of the memory cell are maintained when a power voltage is applied to the word line while the power voltage is applied to the drain region and a (½) VDD voltage is applied to the source region.

12. The nonvolatile ferroelectric memory device according to claim 6, wherein low data are written in the memory cell when the power voltage is applied to the word line while the ground voltage is applied to the drain region and the (½) VDD voltage is applied to the source region.

13. The nonvolatile ferroelectric memory device according to claim 6, wherein data are read in the memory cell when a word line read voltage is applied to the word line while a bit line read voltage is applied to the drain region and the ground voltage is applied to the source region.

14. The nonvolatile ferroelectric memory device according to claim 13, wherein the maximum/minimum values of bit line current are set to be equivalent to voltage values of the word line read voltage in a region where the channel region of the floating channel layer is turned on/off.

15. The nonvolatile ferroelectric memory device according to claim 1, wherein the memory cell has a 1T1C type cell structure.

16. A nonvolatile ferroelectric memory device comprising:
    a memory cell that comprises:
        a SOI-structured substrate including a floating channel layer and drain/source regions located at both ends of the floating channel layer;

a ferroelectric layer formed over the floating channel layer; and a word line formed over the ferroelectric layer, wherein a different channel resistance is induced to a channel region of the floating channel layer depending on polarity states of the ferroelectric layer so that data are read/written;

a register configured to temporarily store data read from the memory cell;

a refresh information register configured to store nonvolatile parameter information for a refresh passing time and a refresh cycle and generate a refresh control signal by using the refresh passing time and the refresh cycle; and a refresh control unit configured to perform a refresh operation in response to the refresh control signal so as to write data stored in the register to the memory cell.

17. The nonvolatile ferroelectric memory device according to claim 16, wherein the refresh control unit comprises:

a refresh controller configured to perform a refresh operation in response to the refresh control signal and to output a refresh signal and a refresh enable signal;

a refresh counter configured to count a refresh cycle in response to the refresh signal and to output a count address; and a row address register configured to select the count address and to output the count address into a row decoder when the refresh enable signal is activated.

18. The nonvolatile ferroelectric memory device according to claim 16, wherein the SOI-structured substrate comprises:

a P-type or N-type semiconductor region substrate;

an insulating layer formed over the substrate; and a floating channel layer formed over the insulating layer, and the floating channel layer including the drain/source regions.

19. The nonvolatile ferroelectric memory device according to claim 16, wherein the memory cell further includes a buffer insulating layer formed between the floating channel layer and the ferroelectric layer.

20. The nonvolatile ferroelectric memory device according to claim 19, wherein the memory cell further includes a floating conductive layer formed between the buffer insulating layer and the ferroelectric layer.

21. The nonvolatile ferroelectric memory device according to claim 16, wherein high data are written in the memory cell when a negative voltage is applied to the word line while a ground voltage is applied to the drain/source regions.

22. The nonvolatile ferroelectric memory device according to claim 16, wherein the high data of the memory cell are maintained when a power voltage is applied to the word line while the power voltage is applied to the drain region and a (½) VDD voltage is applied to the source region.

23. The nonvolatile ferroelectric memory device according to claim 16, wherein low data are written in the memory cell when the power voltage is applied to the word line while the ground voltage is applied to the drain region and the (½) VDD voltage is applied to the source region.

24. The nonvolatile ferroelectric memory device according to claim 16, wherein data are read in the memory cell when a word line read voltage is applied to the word line while a bit line read voltage is applied to the drain region and the ground voltage is applied to the source region.

25. The nonvolatile ferroelectric memory device according to claim 24, wherein the maximum/minimum values of bit line current are set to be equivalent to voltage values of the word line read voltage in a region where the channel region of the floating channel layer is turned on/off.

26. A nonvolatile ferroelectric memory device comprising:

a cell array including a plurality of nonvolatile memory cells each configured to read/write data;

a register configured to temporarily store data read from the plurality of nonvolatile memory cells;

a refresh information register configured to store nonvolatile parameter information for a refresh passing time and refresh cycle and generate a refresh control signal by using the refresh passing time and the refresh cycle;

a refresh control unit configured to control a refresh operation in response to the refresh control signal so as to write data stored in the register to one or more of the plurality of nonvolatile memory cells;

a row address control unit configured to latch and decode a row address in response to a RAS signal and an output signal from the refresh control unit and to select the count address in the refresh mode;

a column address control unit configured to latch and decode a column address inputted in response to a CAS signal; and an input/output logic circuit configured to control read/write operations of the cell array in response to an output enable signal and read/write commands.

27. The nonvolatile ferroelectric memory device according to claim 26, wherein the refresh control unit comprises:

a refresh controller configured to perform a refresh operation in response to the refresh control signal and to output a refresh signal and a refresh enable signal; and a refresh counter configured to count a refresh cycle in response to the refresh signal and to output a count address.

28. The nonvolatile ferroelectric memory device according to claim 27, wherein the refresh information register stores refresh count information and other information on power-off timing in the system/internal memory.

29. The nonvolatile ferroelectric memory device according to claim 28, further comprising a pad array unit having a plurality of pads, and configured to selectively output the row address and the column address with a given time difference to the row address control unit and the column address control unit.

30. The nonvolatile ferroelectric memory device according to claim 29, wherein the row address and the column address are input through the same pad and selectively output with a given time difference.

31. The nonvolatile ferroelectric memory device according to claim 26, wherein the row address control unit comprises:

a row timing logic circuit configured to control the latch timing of the row address in response to the RAS signal;

a row address register configured to latch the row address depending on control of the row timing logic and to selectively output one of the row address and the count address according to a refresh enable signal; and a row decoder configured to decode an output signal from the row address register to output the output signal to the cell array.

32. The nonvolatile ferroelectric memory device according to claim 31, wherein the row address register comprises:

an address buffer and latch configured to buffer and latch the row address; and a selecting unit configured to select one of the count address and output signals of the address buffer and latch in response to the refresh enable signal.

33. The nonvolatile ferroelectric memory device according to claim 32, wherein the selecting unit includes a multiplexer.

34. The nonvolatile ferroelectric memory device according to claim 26, wherein the column address control unit comprises:
- a column timing logic circuit configured to control the latch timing of the column address in response to the CAS signal;
- a column address register configured to latch the column address depending on control of the column timing logic; and
- a column decoder configured to decode an output signal from the column address register.

35. The nonvolatile ferroelectric memory device according to claim 26, wherein the cell array comprises:
- a plurality of word lines arranged in a row direction;
- a plurality of sensing lines arranged in a direction parallel with the word lines in the row directions;
- a plurality of bit lines arranged in a column direction, perpendicular to the row direction, so that the plurality of bit lines are crossed with the word lines and the sensing lines; and
- a plurality of unit cells arranged in a region where the word lines, the sensing lines and the bit lines are crossed.

36. The nonvolatile ferroelectric memory device according to claim 35, wherein the plurality of unit cells share the bit lines and the sensing lines with adjacent unit cells.

37. The nonvolatile ferroelectric memory device according to claim 35, wherein the plurality of unit cells share one active region, and share bit line contacts and sensing line contacts with adjacent unit cells.

38. The nonvolatile ferroelectric memory device according to claim 35, wherein the cell array further comprises:
- a sense amplifier configured to sense and amplify data of the bit line; and
- a write driver configured to output a driving voltage for writing the data in the unit cell to the bit line.

39. The nonvolatile ferroelectric memory device according to claim 26, wherein the memory cell has a 1T-FET type cell structure.

40. The nonvolatile ferroelectric memory device according to claim 26, wherein the memory cell comprises:
- a SOI-structured substrate including a floating channel layer and drain/source regions located at both ends of the floating channel layer;
- a ferroelectric layer formed over the floating channel layer; and
- a word line formed over the ferroelectric layer.

41. The nonvolatile ferroelectric memory device according to claim 40, wherein the SQI-structured substrate comprises:
- a P-type or N-type semiconductor region substrate;
- an insulating layer formed over the substrate; and
- a floating channel layer formed over the insulating layer, the floating channel layer including the drain/source regions.

42. The nonvolatile ferroelectric memory device according to claim 40, wherein the memory cell further includes a buffer insulating layer formed between the floating channel layer and the ferroelectric layer.

43. The nonvolatile ferroelectric memory device according to claim 42, wherein the memory cell further includes a floating conductive layer formed between the buffer insulating layer and the ferroelectric layer.

44. The nonvolatile ferroelectric memory device according to claim 40, wherein high data are written in the memory cell when a negative voltage is applied to the word line while a ground voltage is applied to the drain/source regions.

45. The nonvolatile ferroelectric memory device according to claim 40, wherein the high data of the memory cell are maintained when a power voltage is applied to the word line while the power voltage is applied to the drain region and a (½) VDD voltage is applied to the source region.

46. The nonvolatile ferroelectric memory device according to claim 40, wherein low data are written in the memory cell when the power voltage is applied to the word line while the ground voltage is applied to the drain region and the (½) VDD voltage is applied to the source region.

47. The nonvolatile ferroelectric memory device according to claim 40, wherein data are read in the memory cell when a word line read voltage is applied to the word line while a bit line read voltage is applied to the drain region and the ground voltage is applied to the source region.

48. The nonvolatile ferroelectric memory device according to claim 47, wherein the maximum/minimum values of bit line current are set to be equivalent to voltage values of the word line read voltage in a region where the channel region of the floating channel layer is turned on/off.

49. A nonvolatile ferroelectric memory device comprising:
- a cell array including a plurality of nonvolatile memory cells each configured to read/write data;
- a register configured to temporarily store data read from the plurality of nonvolatile memory cells;
- a refresh information register configured to store nonvolatile parameter information for a refresh passing time and a refresh cycle and generate a refresh control signal by using the refresh passing time and the refresh cycle;
- a refresh control unit configured to activate a refresh signal in response to a RAS signal, a GAS signal and the refresh control signal;
- a refresh counter configured to generate a count address in response to the refresh signal; and
- a column timing logic circuit configured to write data stored in a register in the memory cell corresponding to the count address.

50. The nonvolatile ferroelectric memory device according to claim 49, wherein the refresh signal is activated when the RAS signal and the GAS signal are simultaneously transited.

51. The nonvolatile ferroelectric memory device according to claim 49, wherein the refresh signal is activated when the GAS signal transitions earlier than the RAS signal.

52. The nonvolatile ferroelectric memory device according to claim 49, wherein the column timing logic circuit is controlled in response to the GAS signal.

53. The nonvolatile ferroelectric memory device according to claim 49, wherein the refresh information register stores refresh count information and other information on power-off timing in the system/internal memory.

54. A method for refreshing a nonvolatile ferroelectric memory device, the method comprising the steps of:
- reading/writing data in a memory cell which has a 1T-FET type nonvolatile cell structure;
- storing nonvolatile parameter information for a refresh passing time and a refresh cycle and generating a refresh control signal by using the refresh passing time and the refresh cycle; and
- refreshing data of the memory cell in response to the refresh control signal.

55. The method according to claim 54, wherein the refresh step includes the steps of:
- reading data stored in the memory cell to store the data in a register;
- writing high data in the memory cell; and
- writing data stored in the register into the memory cell to retain high data stored in the memory cell or writing low data in the memory cell.

56. The method according to claim 54, wherein the refresh period is divided into the same time to refresh the memory cell in the refresh period.

57. The method according to claim 56, wherein the refresh cycle is set by (refresh time)/(row address number).

58. The method according to claim 54, wherein further comprising the steps of:
performing the refresh operation continuously on a row address in a burst refresh cycle period; and
performing the read/write operations in a read/write operation cycle period.

59. A method for refreshing a nonvolatile ferroelectric memory device, the method comprising the steps of:
sensing input of a RAS signal;
sensing input of a GAS signal;
activating a refresh signal in response to the RAS signal and the GAS signal;
generating a count address in response to the refresh signal;
storing nonvolatile parameter information for a refresh passing time and a refresh cycle and generating a refresh control signal by using the refresh passing time and the refresh cycle; and
refreshing data of a memory cell in response to the refresh control signal by writing data stored in a register in the memory cell corresponding to the count address.

60. The method according to claim 59, wherein the refresh signal is activated when the RAS signal and the GAS signal simultaneously transition.

61. The method according to claim 59, wherein the refresh signal is activated when the GAS signal transitions earlier than the RAS signal.

62. The method according to claim 59, wherein the write step is performed when the GAS signal is enabled.

63. The method according to claim 59, wherein the refreshing data of the memory cell comprises the steps of:
reading the nonvolatile refresh count information and the power-off timing information;
sensing the power-on state;
determining whether the previously stored refresh timing is exceeded; and
uploading data of the memory when the refresh timing is exceeded to perform a refresh operation, and performing the previous refresh operation when the refresh timing is not exceeded.

64. The method according to claim 63, wherein the refresh operation is controlled by a system timer when the power is turned off.

* * * * *